United States Patent [19]

Mori et al.

[11] Patent Number: 5,039,580
[45] Date of Patent: Aug. 13, 1991

[54] BATTERY STORAGE STRUCTURE IN ELECTRIC APPLIANCE

[75] Inventors: Kusuki Mori, Yamatokoriyama; Noriyuki Mikake, Nara, both of Japan

[73] Assignee: Sharp Kabushiki Kaisha, Japan

[21] Appl. No.: 604,500

[22] Filed: Oct. 26, 1990

[30] Foreign Application Priority Data

Oct. 31, 1989 [JP] Japan ................................. 1-285489

[51] Int. Cl.$^5$ ............................................. H01M 2/10
[52] U.S. Cl. .................................... 429/97; 429/99; 429/100
[58] Field of Search ....................... 429/96–100, 429/121, 123, 1; 439/627

[56] References Cited

U.S. PATENT DOCUMENTS

| | | | |
|---|---|---|---|
| 3,984,257 | 10/1976 | Zurcher | 429/1 |
| 4,828,944 | 5/1989 | Yabe et al. | 429/97 |
| 4,842,966 | 6/1989 | Omori et al. | 429/96 |
| 4,957,831 | 9/1990 | Meredith et al. | 429/121 |
| 4,993,973 | 2/1991 | Selinko | 439/627 |

Primary Examiner—Anthony Skapars
Attorney, Agent, or Firm—Nixon & Vanderhye

[57] ABSTRACT

A battery storage structure in an electric appliance which comprises a housing for the electric appliance having at least one side face, said housing also having at least first and second storage compartments defined therein, each of said first and second storage compartments having an aperture open at said side face of the housing. Each of the battery storage compartments accommodate a respective first or second battery mount for the support of at least one battery, at least one drive battery on the first battery mount and at least one backup battery on the second battery mount. Each first or second battery mount is movable between a completely inserted position and a drawn position relative to the associated battery storage compartment. A manipulatable means is provided, which is operable to permit one of the first and second battery mounts to be movable from the completely inserted position towards the drawn position and to inhibit the other of the first and second battery mounts from being moved from the completely inserted position towards the drawn position.

7 Claims, 11 Drawing Sheets

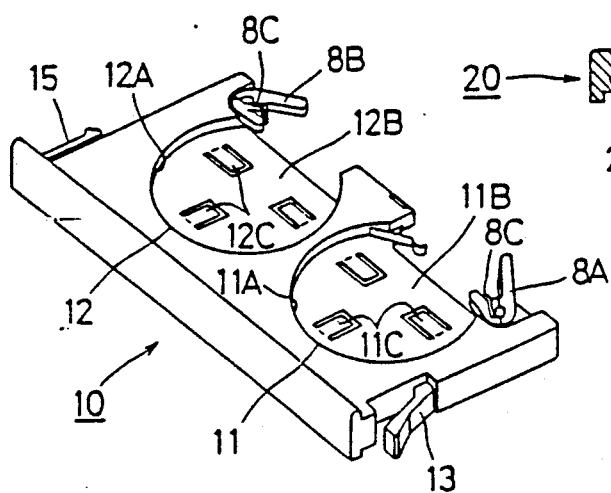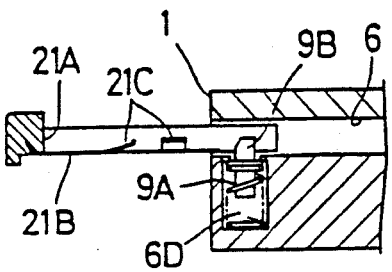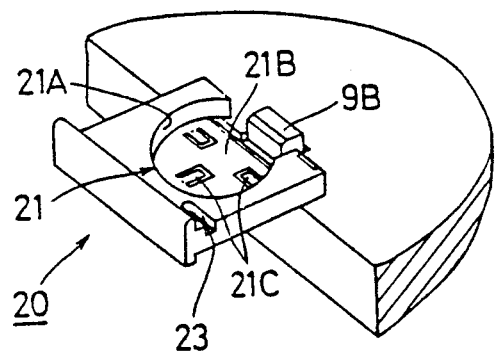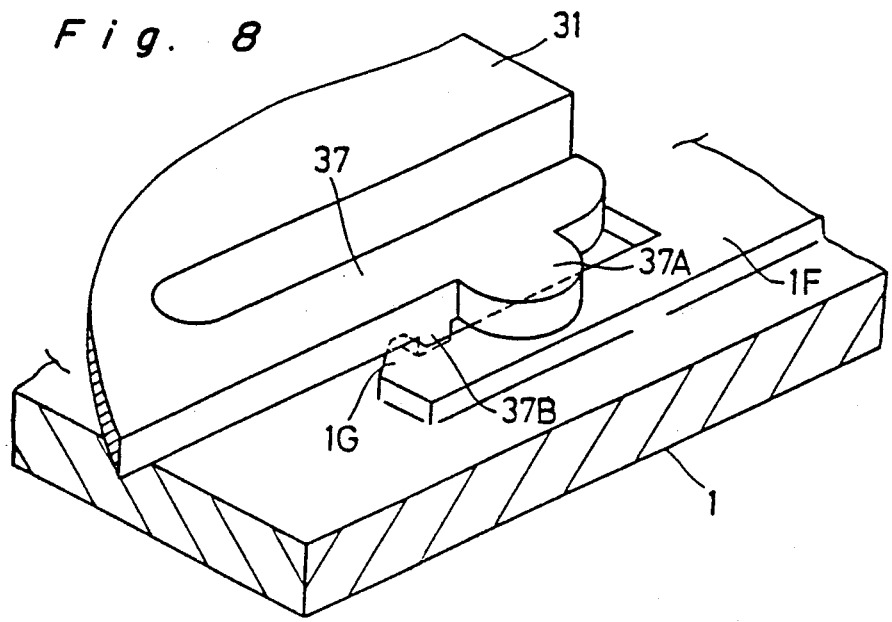

BATTERY STORAGE STRUCTURE IN ELECTRIC APPLIANCE

BACKGROUND OF THE INVENTION

1. Field of the Invention

The present invention relates to a battery storage mechanism in a battery-powered electric and/or electronic appliances such as an electronic calculator, an electronic memo, an electronic directory or the like.

2. Description of the Prior Art

A vast number of battery-powered electric and/or electronic appliances such as listed above is equipped with at least one erasable storage unit such as a random access memory for the storage of data inputted into the electric appliance. The problem hitherto encountered with this volatile storage unit is that all of the data inputted are erased the moment the battery in the electric appliance is run down or removed.

Therefore, it is a currently employed practice to employ a power storage capacitor parallel to a circuit line connecting between the electric power source and the storage unit so that, when the battery is removed, an electric charge built up in the power storage capacitor can be utilized for the power supply to the storage unit. This is effective to avoid any possible sudden erasure of the data stored in the storage unit. However, the removal of one battery is required to be followed by an immediate replacement with a fresh battery, or the electric charge in the power storage capacitor will run down with the stored data erased consequently.

In view of the foregoing, attempts have been made to use, in addition to a drive battery for driving major circuit component parts of the electric appliance, a back-up battery that is brought into operation to supply an electric power only to the storage unit and its associated component parts when the drive battery runs down or is to be removed. The use of the two batteries appears sophisticated, however, the conventional structure for accommodating such two batteries in the electric appliance is of a design that those batteries can be removed simultaneously, or of a design that, even though a means is provided for an alternate removal of the batteries, such means may occasionally work ineffective in the sense that the user of the electric appliance, if desiring, can remove them simultaneously or in succession.

For example, the Japanese Laid-open Utility Model Publication No. 59-88868, published June 15, 1984, discloses a battery storage structure having at least two juxtaposed pocket defined in a base plate for accommodating respective batteries. With the batteries seated within the respective pockets, each battery is retained in position within the associated pocket by means of a retainer strip extending over the respective battery with one end fitted into the base and the opposite end secured to the base by means of a set screw. To avoid a simultaneous removal of both batteries when and after both screws have been removed, this publication makes use of a tongue resiliently pivotable from a neutral position to any one of lateral positions defined on respective sides of the neutral position. This resiliently pivotable tongue has a width effective to avoid any possible simultaneous removal or detachment of the retainer strips even though the screws used to secure the respective ends of the retainer strips to the base have been removed, so long as the tongue is held in the neutral position. When the tongue is pivoted from the neutral position to one of the lateral positions by the application of an external force, one of the retainer strips remote from such one of the lateral positions for the tongue can be removed, allowing the battery, which has been retained in position within the associated pocket by means of such one of the retainer strips, to be removed.

According to the Japanese Laid-open Utility Model Publication No. 62-160459, published Oct. 12, 1987, and assigned to the same assignee of the present invention, discloses the at least two batteries retained within the respective pockets by means of a rotary retainer member having at least first and second portions spaced from each other with respect to the axis of rotation of the rotary retainer member. While the first portion of the rotary retainer member overlays one of the battery, the second portion is defined by two engagement pieces protruding radially outwardly of the circular path of movement of the retainer member for the engagement with a peripheral region of the other of the batteries. The rotary retainer members are shown and described as either a generally rectangular plate or a rotary disc having a radially inwardly recessed edge from which the engagement pieces extend radially outwardly.

The Japanese Laid-open Utility Model Publication No. 64-56142, published Apr. 7, 1989, discloses a battery storage structure substantially similar to the structure disclosed in the JP Laid-open UM Publication No. 62-160459 referred to above, but employs the rotary retainer member in the form of a sector-shaped plate movable from a neutral position to any one of lateral positions. This publication No. 64-56142 also discloses the use of resiliently retractable stoppers to keep the sector-shaped retainer plate in the neutral position, thereby to avoid any possible arbitrary movement of the retainer plate.

The Japanese Laid-open Utility Model Publication No. 62-160461, published Oct. 12, 1987, and assigned to the same assignee of the present invention, discloses a battery storage structure substantially similar to the structure disclosed in JP Laid-open UM Publication No. 62-1604459, but employs additionally a means for avoiding any possible arbitrary movement of the rectangular retainer member from one position to the opposite position once it has been moved from such opposite position to such one position with the associated battery removed. This means comprises a generally elongated members having a substantially intermediate portion integrated with the rectangular retainer member for movement together therewith and also having opposite ends engageable selectively into respective detent recesses that are communicated with the battery pockets. The movement of the retainer member is enabled only when a fresh battery is inserted into any one of the pockets which has been left vacant as a result of the removal of the used battery.

Again, the Japanese Laid-open Utility Model Publication No. 64-19256, published Jan. 31, 1989, and assigned to the same assignee of the present invention, discloses a generally rectangular slidable retainer plate supported for movement in a direction perpendicular to a line extending between the respective centers of the battery pockets. This slidable retainer plate has one end portion integrally formed with a lateral flange protruding outwardly from one side of the plate and the opposite end portion integrally formed with a similar lateral flange protruding outwardly from the opposite side of the plate. The flanges are offset relative to each other and protrude in the respective directions opposite to each other. When in the neutral position, the flanges of the retainer plate retains the respective batteries within the associated pocket, but when moved to one of the opposite positions on respective sides of the neutral position, one of the flanges clears from the associated battery while the other of the flanges remains in position to retain the other battery in the associated battery pocket. According to another embodiment disclosed therein, a means for avoiding any possible arbitrary movement of the retainer plate from the neutral position to any one of the lateral positions is also provided, which comprises a block piece, for each of the battery pocket, supported for movement in a direction perpendicular to the direction of movement of the retainer plate between block and release positions. When one of the block pieces is in the block position inhibiting the movement of the retainer plate from the neutral position towards one of the lateral positions, the other of the block piece is in the release position permitting the movement of the retainer plate from the neutral position towards the other of the lateral positions.

Although less pertinent to the present invention, the Japanese Laid-open Utility Model Publication No. 63-69360, published May 10, 1988, discloses a generally flat removable battery casing adapted to support thereon a flat battery and to be inserted into a battery chamber defined in the electric appliance. The battery casing looks like a desk drawer and has a spring strip integral with a wall of the casing and having first and second resilient portions opposite to each other. When and so long as the battery casing is accommodated within the battery chamber, the first and second resilient portions of the spring strip are engaged into detent recesses to avoid any possible detachment of the battery casing out from the battery chamber. Simultaneous disengagement of the first and second resilient portions from the associated detent recesses takes place when a pin or any thin member is inserted exteriorly to buckle the spring strip inwardly allowing the first and second resilient portions to be set back from the associated detent recesses.

Except for the disclosure made in the last mentioned publication, the system disclosed in any one of the foregoing publications is effective to avoid any possible erroneous removal of the plural batteries at one time which would eventually result in the erasure of the data stored in the volatile storage unit in the electric appliance. However, such system has been found having some inconveniences which will now be discussed.

In the first place, in order to make an access to any one of the batteries, a lid closing the battery chamber has to be removed with the use of a screw driver or the like. Also, it may often occur that the lid and/or a screw used to set the lid in position are likely to be lost when removed from the electric appliance in an attempt to carry out the battery replacement.

The removal of the lid used to close the battery chamber allow internal printed circuit boards and/or circuit component parts to be exposed bare to the outside and, therefore, depending on the type of electric appliance, some electronic component parts such as, for example, LSI elements, may be destroyed either physically or logically by the effect of an electrostatic charge built up on the user of the electric appliance.

Apart from the foregoing, it is generally recognized that the removal of the drive battery for the replacement with a fresh one may cause a drive unit (CPU or central processing unit) to run out of control to such an extent as to result in a logical destroy of the data stored in the storage unit such as a random access memory. In order to minimize this possibility, an attempt has been made to provide the electric appliance with a switching system operable to selectively establish a normal operating mode, in which an electric circuit between the drive unit and the storage unit is established, and a battery replacement mode in which the electric circuit therebetween is opened during the replacement of the battery. However, if the user of the electric appliance fails to manipulate the switching system to open the circuit between the drive and storage units prior to the actual replacement of the battery, this sophisticated switching system will not work and the drive unit will eventually run out of control.

SUMMARY OF THE INVENTION

The present invention has been devised with a view to substantially eliminating the above discussed problems inherent in the prior art battery storage structures. Accordingly, one object of the present invention is to provide an improved battery storage structure effective to substantially eliminate the need to use any tool for the removal of the battery lid and also to substantially eliminate any possible destruction of the circuit component parts resulting from a conduction of the electrostatic charge from the body to such circuit component parts.

Another object of the present invention is to provide an improved battery storage structure of the type referred to above, which is also effective to minimize the possibility in which the drive unit may run out of control consequent upon the replacement of the battery.

A further object of the present invention is to provide an improved battery storage structure of the type referred to above, which is effective to minimize a possible inadvertent erasure of the stored data resulting from a user's careless handling during the battery replacement.

In order to accomplish the above described objects, the present invention according to one aspect thereof provides a battery storage structure in an electric appliance which comprises a housing for the electric appliance having at least one side face, said housing also having at least first and second storage compartments defined therein, each of said first and second storage compartments having an aperture open at said side face of the housing. Each of the battery storage compartments accommodate a respective first or second battery mount for the support of at least one battery, at least one drive battery on the first battery mount and at least one back-up battery on the second battery mount. Each first or second battery mount is movable between a completely inserted position and a drawn position relative to the associated battery storage compartment. A manipulatable means is provided, which is operable to permit one of the first and second battery mounts to be movable from the completely inserted position towards the drawn position and to inhibit the other of the first and second battery mounts from being moved from the completely inserted position towards the drawn position.

Preferably, the manipulatable means may be provided with a mode changeover switch capable of assuming one of a normal operating mode, in which a drive unit of the electric appliance is permitted to selectively read in and read out information to a storage unit, and a battery replacement mode in which the drive unit is disabled to read in and read out the information, said mode changeover switch being operatively associated with the manipulatable means.

Also, in order to render any one of the first and second battery mounts immovable in the event that the other of the first and second battery mounts has been moved to the drawn position thereby to avoid the possibility that both of the back-up battery and the drive battery are disconnected from an electric system of the electric appliance, the battery storage structure may preferably include means for constricting one of the first and second battery mounts at the completely inserted position when and so long as the other of the first and second battery mounts has been moved to the drawn position.

Again, in order to render any one of the first and second battery mounts, which has been moved to the drawn position, to be immovable at the drawn position thereby to prevent any possible movement of such one of the first and second battery mount from being moved towards the completely inserted position with no battery mounted thereon, the battery storage structure according to the present invention may preferably have a barrier means provided in association with each of the first and second battery mounts for blocking the movement of the respective battery mount from the drawn position back to the completely inserted position when the respective battery mount has no battery mounted thereon.

According to another aspect of the present invention, there is provided a battery storage structure in an electric appliance which comprises a housing for the electric appliance having at least one side face, said housing also having at least first and second storage compartments defined therein, each of said first and second storage compartments having an aperture open at said side face of the housing; first and second battery mounts one for each battery storage compartment, each of said first and second battery mounts being accommodated within the associated battery storage compartment for movement between a completely inserted position and a drawn position; and a barrier means provided in association with each of the first and second battery mounts for blocking the movement of the respective battery mount from the drawn position back to the completely inserted position when the respective battery mount has no battery mounted thereon.

Even the battery storage structure according to such another aspect of the present invention may have a manipulatable means operable to permit one of the first and second battery mounts to be movable from the completely inserted position towards the drawn position and to inhibit the other of the first and second battery mounts from being moved from the completely inserted position towards the drawn position.

Thus, according to the present invention, the replacement of the drive battery or batteries and that of the back-up battery cannot be effected simultaneously and can be effected selectively. This means that, when one of the drive and back-up batteries is being replaced with a corresponding fresh battery, the electric system in the electric appliance is kept active by the supply of an electric current from the other of the drive and back-up batteries, and therefore, any possible erasure of the information stored in the storage unit, which would occur when the electric system is no longer powered, can be positively avoided. Furthermore, the replacement of any one of the drive battery or batteries and the back-up battery does not require a preparatory opening of a lid hitherto required and, therefore, the battery replacement can be easily and quickly performed, thereby minimizing the possibility that the information stored in the storage unit and/or some electronic component parts of the electric system may be destroyed under the influence of the electrostatic charge built up in the body of the user or operator.

Also, the slide member is operable to selectively allow the battery mounts ready to be drawn outwardly of the associated battery storage compartments is operatively associated with the mode changeover switch for switching over between a normal operating mode, in which a drive unit of the electric appliance is permitted to selectively read in and read out information to a storage unit, and a battery replacement mode in which the drive unit is disabled to read in and read out the information. Therefore, the possibility of the drive unit running out of control as a result of the battery replacement can be advantageously minimized.

Yet, according to the present invention, since arrangement has been made that, when one of the battery mounts is drawn outwardly from the associated battery storage compartment, the other of the battery mounts is locked at the completely inserted position, the possibility of all of the batteries being removed can be avoided advantageously. Furthermore, unless either the drive battery, or batteries, or the back-up battery is mounted on the associated battery mount, the latter can be pulled deep into the associated battery storage compartment, thereby preventing the other battery mount from being drawn outwardly from the associated battery storage compartment.

BRIEF DESCRIPTION OF THE DRAWINGS

These and other objects and features of the present invention will become clear from the following description taken in conjunction with preferred embodiments thereof with reference to the accompanying drawings, in which:

FIG. 5 is a perspective view of a first battery casing or mount forming a part of the battery storage structure according to the first preferred embodiment of the present invention;

FIG. 6 is a perspective view of a second battery casing or mount forming another part of the battery storage structure according to the first preferred embodiment of the present invention;

FIG. 7 is a side sectional view showing the second battery mount being drawn outwardly from a second storage compartment;

FIG. 8 is a perspective view, on an enlarged scale, showing a portion of a slide member used in the battery storage structure according to the first preferred embodiment of the present invention;

DETAILED DESCRIPTION OF THE EMBODIMENT

While the present invention is applicable to any battery-powered electric appliance utilizing at least two batteries, in describing preferred embodiments of the present invention reference will be made to an electronic versatile calculator which can be used as calculator, directory, diary, clock, alarm, organizer, word finder, dictionary and so on.

Figure 1:
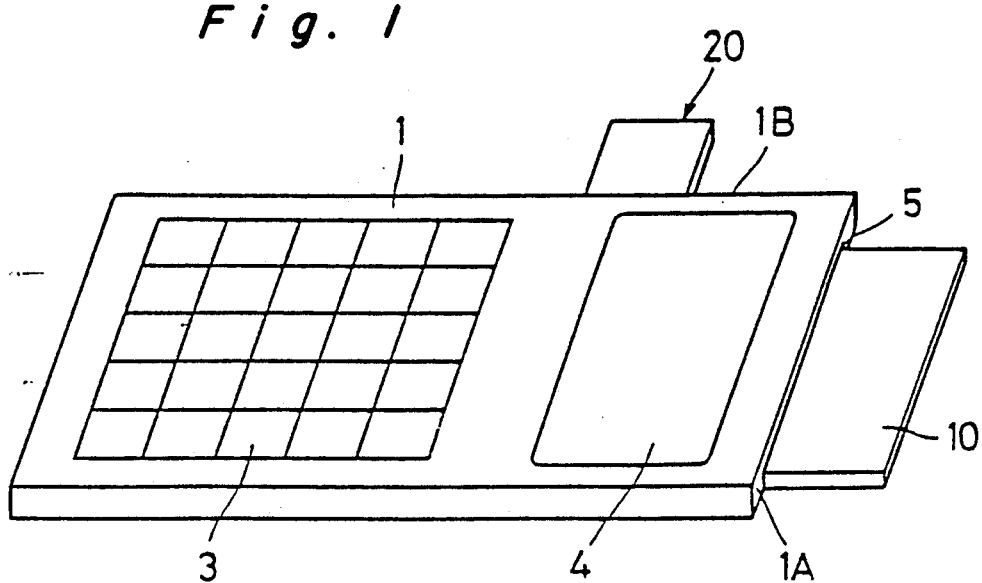
FIG. 1 is a schematic perspective view of an electronic appliance showing a front face thereof.
Figure 2:
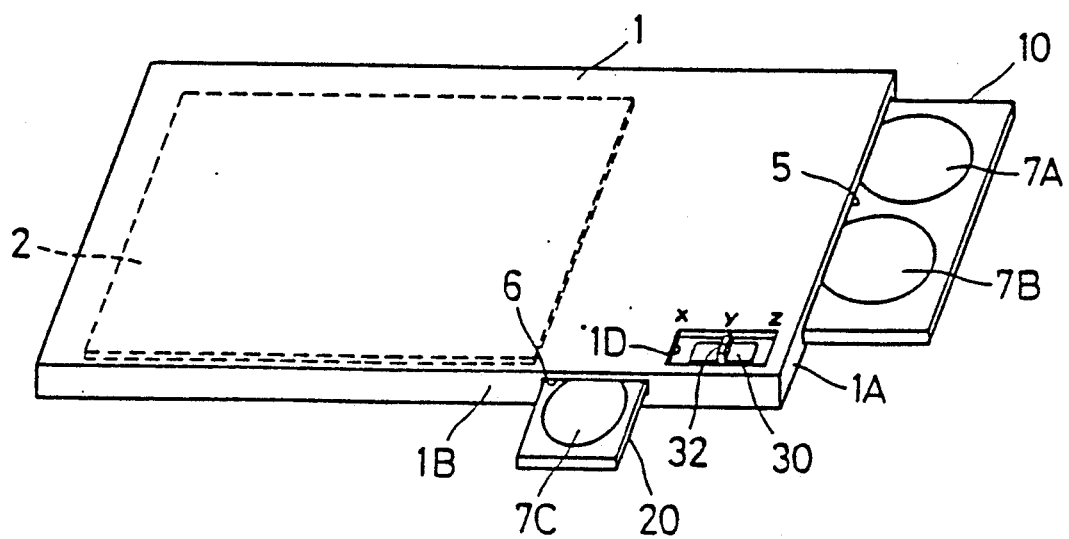
FIG. 2 is a view similar to FIG. 1, showing a bottom face thereof.

FIGS. 1 to 16 illustrate a battery storage structure used in the electronic calculator according to a first preferred embodiment of the present invention. As best shown in FIGS. 1 and 2, the electronic calculator comprises a generally rectangular flat casing 1 having a printed circuit board 2 installed within the casing 1, an input keyboard 3 having a plurality of manipulatable keys exposed to the outside for the access of an operator's finger for the entry of information, and a liquid crystal display unit 4 juxtaposed to the keyboard 3 for the display of information processed by the electronic calculator.

Referring to FIGS. 1 to 8, the calculator housing 1 has a front panel where the keyboard 3 and the display unit 4 are exposed, a bottom panel, a pair of side walls (only one of which is shown by 1B) opposite to each other and a pair of end walls (only one of which is shown by 1A) opposite to each other, all of them being assembled to render the calculator housing 1 to represent a generally rectangular flat box-like configuration. A portion of one of the end walls, for example, the end wall 1A, of the calculator housing 1 adjacent the display unit 4 is opened outwardly and in communication with a first battery compartment 5 defined inside the calculator housing 1. Similarly, a portion of one of the side walls, for example, the side wall 1B, of the calculator housing 1 adjacent the display unit 4 is opened outwardly and in communication with a second battery compartment 6 defined inside the calculator housing 1.

The first battery compartment 5 is adapted to receive therein a generally rectangular first battery mount 10 for the support thereon of a pair of generally flat disc-shaped drive batteries 7A and 7B in juxtaposed fashion, whereas the second battery compartment 6 is adapted to receive therein a generally square second battery mount 20 for the support thereon of a generally flat disc-shaped back-up battery 7C. A slide member 30 is disposed within an intermediate space 1C defined in the calculator housing 1 between the first and second battery compartments 5 and 6 and positioned substantially in alignment with one of the four corners of the calculator housing 1. This slide member 30 is adapted to be manually slid from a neutral position to any one of two lateral positions on respective sides of the neutral position in a direction parallel to the longitudinal sense of the calculator housing 1.

Figure 4:
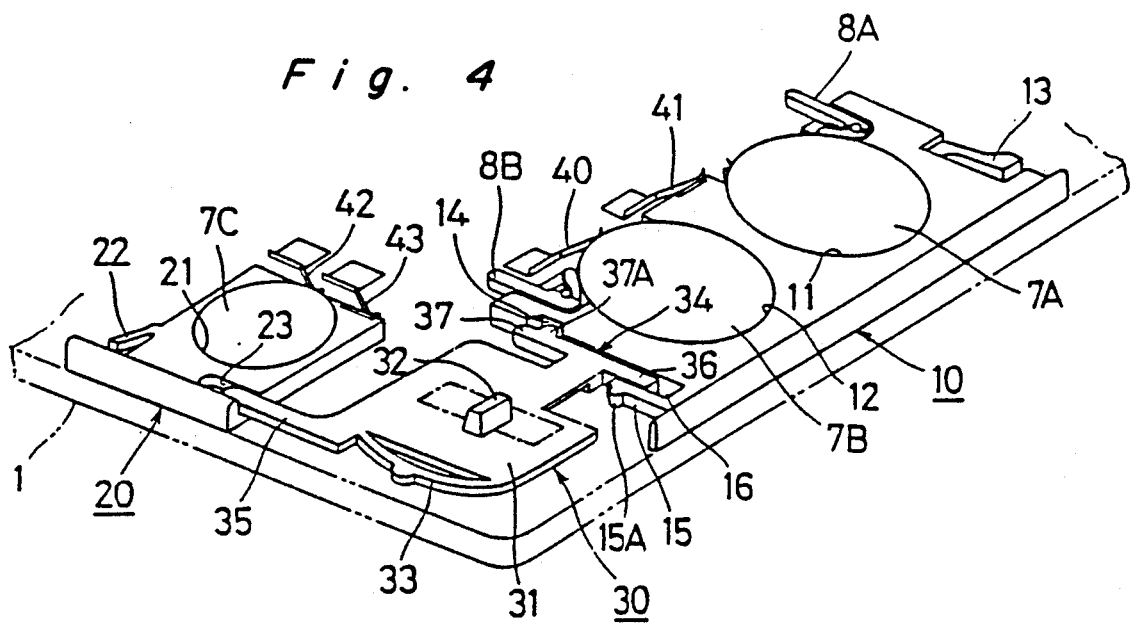
FIG. 4 is a perspective view of the battery storage structure shown in FIG. 3.

As best shown in FIG. 4, the first battery mount 10 has a pair of juxtaposed round pockets 11 and 12 defined in side-by-side fashion in a direction longitudinally thereof, said pockets 11 and 12 being adapted to accommodate the respective drive batteries 7A and 7B. As best shown in FIG. 5, each of those pockets 11 and 12 is defined by a respective wall 11A or 12A, left by the formation of a round hole extending completely through the thickness of the first battery mount 10, and a respective electric terminal disc 11B or 12B secured to the first battery mount 10 so as to close one opening of the associated round hole thereby to define a bottom wall. This first battery mount 10 has a first resilient tongue 13 formed integrally with, or otherwise connected to, one of the opposite end edges thereof remote from the intermediate space 1C so as to protrude laterally outwardly therefrom, and also has a cam groove 14, a second resilient tongue 15 and a generally U-shaped cutout 16 all defined in the other of the opposite end edges thereof. It is to be noted that the second resilient tongue 15 is in practice formed by cutting one end of the first battery mount 10 adjacent the intermediate space 1C so as to define the U-shaped cutout 16, leaving the second resilient tongue 15 integral with such one end of the first battery mount 10. Alternatively, the first battery mount 10 may be formed by the use of any known extrusion or injection molding technique with all necessary elements 11, 12, 13, 14, 15 and 16 formed therein.

Figure 3:
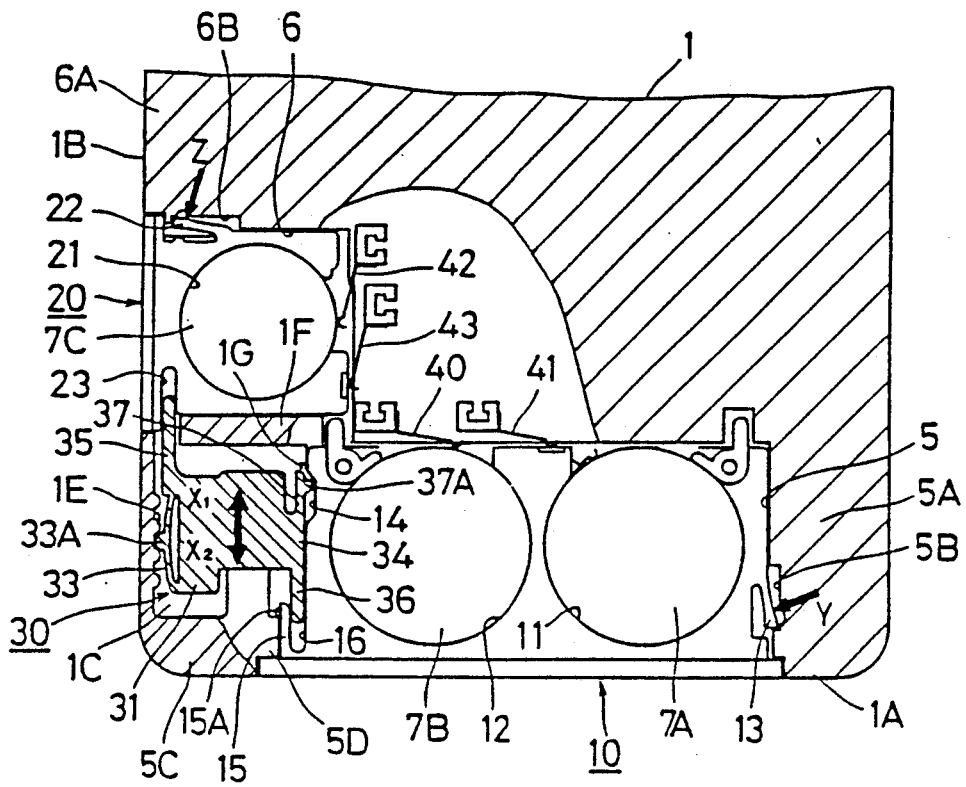
FIG. 3 is a sectional view of a battery storage structure used in the electronic appliance according to a first preferred embodiment of the present invention.
Figure 13:
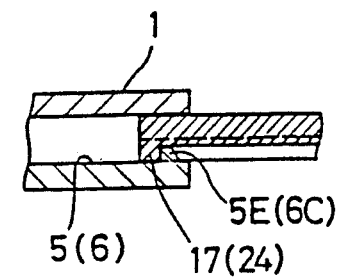
FIG. 13 is a side sectional view, showing the first battery mount having been drawn outwardly from the first storage compartment.

As best shown in FIG. 5, each of the electric terminal discs 11B and 12B has a plurality of, for example, three, resilient contact pieces 11C and 12C formed by slitting or lancing relevant portions of the terminal disc 11B and 12B so as to eventually protrude into the associated pocket 11 and 12. Those resilient contact pieces 11C and 12C in each terminal disc 11B and 12B are adapted not only to be held in firm contact with a negative electrode of the associated drive battery 7A and 7B, but also to facilitate a proper pop-up of the associated drive battery 7A and 7B in readiness for the removal thereof out from the respective battery pocket 11 and 12 when the first battery mount 10 is drawn out from the first battery compartment 5 in a manner as will be described later. One end wall face forming a part of the wall defining the first battery compartment 5, which confronts the first resilient tongue 13 in the first battery mount 10, is formed with a detent recess 5B cooperable with the first resilient tongue 13. On the other hand, cooperable with the second resilient tongue 15 in the first battery mount 10 is a detent projection 5d formed integrally with a rib 5C which forms another end wall of the first battery compartment 5 remote from the first resilient tongue 13. Hence, when and so long as the first battery mount 10 is completely inserted into the first battery compartment 5 as shown in FIG. 3, the first resilient tongue 13 engaged in the detent recess 5B while the second resilient tongue 15 is trapped by the detent projection 5D through a semicircular detent protuberance 15A integral with the second resilient tongue 15, with the first battery mount 10 consequently retained in a completely inserted position. Referring to FIG. 13, in order to ensure that the first battery mount 10 will not detach from the first battery compartment 5 even when drawn outwardly from the compartment 5, the first battery mount 10 has a rear edge integrally formed with a projection 17 protruding downwardly as viewed in FIG. 13, which projection 17 is trapped by a rib 5E formed integrally with one end of the bottom panel of the calculator housing 1 adjacent the opening leading to the first battery compartment 5.

Referring particularly to FIGS. 3, 4 and 6 to 9, the second battery mount 20 has a pocket 21 defined therein and adapted to accommodate the back-up battery 7C. As best shown in FIG. 6, the pocket 21 is defined by a wall 21A, left by the formation of a round hole extending completely through the thickness of the second battery mount 20, and an electric terminal disc 21B secured to the second battery mount 20 so as to close one open end of the round hole thereby to define a bottom wall. This second battery mount 20 has a third resilient tongue 22, similar to the first resilient tongue 13, formed integrally with, or otherwise connected to, one of the opposite side edges thereof remote from the intermediate space 1C so as to protrude laterally outwardly therefrom, and also has a generally U-shaped groove 23 defined therein so as to extend in a direction perpendicular to the direction of movement of the second battery mount 20 between a completely inserted position and a drawn position, which direction is perpendicular to the direction of movement of the first battery mount 10 between the completely inserted position and the drawn position. As is the case with the first battery mount 10, the second battery mount 20 may be formed by the use of any known extrusion or injection molding technique with all necessary elements 21, 22 23 formed therein.

As best shown in FIG. 5, the electric terminal disc 21B has a plurality of, for example, three, resilient contact pieces 21C formed by slitting or lancing relevant portions of the terminal disc 21B so as to eventually protrude into the associated pocket 21. Those resilient contact pieces 21C in the terminal disc 21B are adapted not only to be held in firm contact with a negative electrode of the back-up battery 7C, but also to facilitate a proper pop-up of the back-up drive battery 7C in readiness for the removal thereof out from the battery pocket 21 when the second battery mount 20 is drawn out from the second battery compartment 20 to the drawn position.

One side wall face forming a part of the wall defining the second battery compartment 6, which confronts the third resilient tongue 22 in the second battery mount 20, is formed with a detent recess 6B cooperable with the second resilient tongue 22. Also, as best shown in FIG. 13, in order to ensure that the second battery mount 20 will not detach from the second battery compartment 6 even when drawn outwardly from the compartment 6, the second battery mount 20 has a rear edge integrally formed with a projection 24 protruding downwardly as viewed in FIG. 13, which projection 24 is trapped by a rib 6C formed integrally with one end of the bottom panel of the calculator housing 1 adjacent the opening leading to the second battery compartment 6. Thus, it will readily be seen that the second battery mount 20 can also be moved between the completely inserted position, as shown in FIG. 3, and the drawn position in a manner similar to the movement of the first battery mount 10 described hereinbefore.

The details of the slide member 30 are best shown in FIGS. 3 and 4 in the form as reversed upside down. Referring to these figures, the slide member 30 is operatively accommodated within the intermediate space 1C situated between the first and second battery storage compartments 5 and 6 and comprises a generally square flat body 31. The flat body 31 is of one piece construction including a manipulatable knob 32 formed integrally with a lower surface so as to protrude outwardly through a slot 1D (FIG. 10. Also, shown by the phantom line in FIG. 4), defined in the bottom panel of the calculator housing 1, for the access of the operator's finger thereto. The flat body 31 also includes a generally elongated, resiliently deformable arcuate arm 33 having its opposite ends formed integrally with one side edge of the flat body 31, and a generally T-shaped latch member 34 formed integrally with another side edge of the flat body 31 opposite to the side where the resiliently deformable arcuate arm 33 is formed. The flat body 31 further includes a second latch piece 35 integrally formed therewith so as to extend from one corner region of the flat body 31 adjacent the joint between one end of the arcuate arm 33 and the flat body 31 in a direction generally parallel to the direction of movement of the slide member 30 and so as to protrude into the second battery storage compartment 6 and then into a generally U-shaped cutout 23 defined in the second battery mount 20 so long as the latter is in a completely inserted position having been inserted into the second battery storage compartment 6.

A detent protuberance 33A is integrally formed with a generally intermediate portion of the arcuate arm 33 for selective engagement into any one of three detent notches 1E formed in an interior surface of one side wall of the calculator housing 1 so as to confront the slide member 30. As will be described later in detail, so long as the slide member 30 is in the neutral position, the detent protuberance 33A is engaged in an intermediate detent notch 1E between the other two detent notches 1E by the effect of a resilient force built up in the arcuate arm 33.

The T-shaped latch member 34 has a first latch piece 36 and a cam piece 37 both aligned with each other and extending in respective directions opposite to each other from a connecting piece through which the first latch piece 36 and the cam piece 37 are integrated with the flat body 31 of the slide member 30. The first latch piece 36 extending in a direction parallel to the direction of movement of the slide member 30 protrudes into the U-shaped cutout 16 defined between the second tongue 15 and the adjacent side edge of the first battery mount 10, while the cam piece 37 also extending in a direction parallel to the direction of movement of the slide member 30 is resiliently engaged in the cam groove 14, defined in that side edge of the first battery mount 10, through a cam protuberance 37A formed integrally with a free end of the cam piece 37.

As best shown in FIG. 8, the cam piece 27 having the cam protuberance 37A is also formed with an engagement projection 37B situated generally intermediate of the length thereof and extending from an upper surface thereof towards the front panel of the calculator housing 1. This engagement projection 37B integral with the cam piece 27 is normally trapped by a hook member 1G integrally formed with a rib 1F which is in turn formed integrally with an interior surface of the front panel of the calculator housing 1 so as to divide between the intermediate space 1C and the second battery storage compartment 6. Disengagement of the engagement projection 37b from the hook member 1G takes place when the cam piece 37 is yielded against its own resiliency in a direction close towards the flat body 31 as shown by the arrow in FIG. 9. As will become clear from the subsequent description, the engagement between the engagement projection 37B and the hook member 1G is effective to disable any possible movement of the slide member 30, then moved to one of the lateral positions from the neutral position, thereby to ensure that, when and so long as one of the first and second battery mounts 10 and 20 is drawn outwardly to the drawn position, the other of the first and second battery mounts 10 and 20 can be constrained at the completely inserted position and will not be moved to the drawn position in any way whatsoever.

Figure 10:
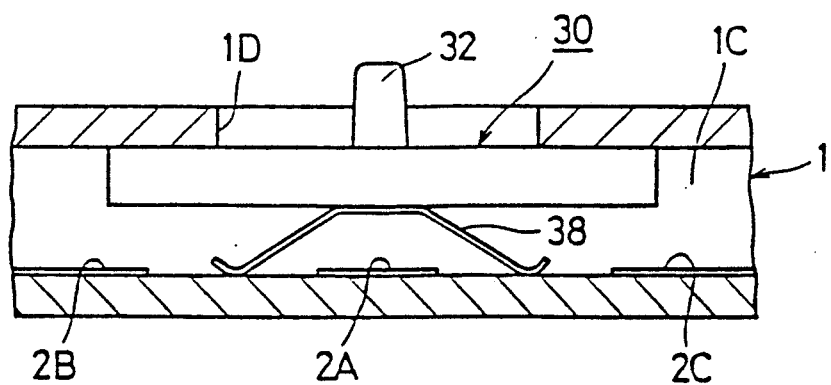
FIG. 10 is a side sectional view showing the slide member and a movable contact member secured thereto for movement together therewith.
Figure 11A:
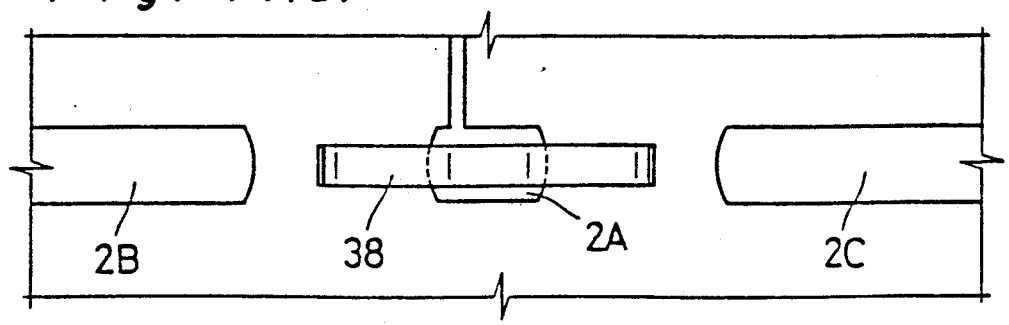
FIGS. 11(a) to 11(c) are top plan views, with the slider member removed, showing the movable contact member brought to different operative positions, respectively.
Figure 11B:
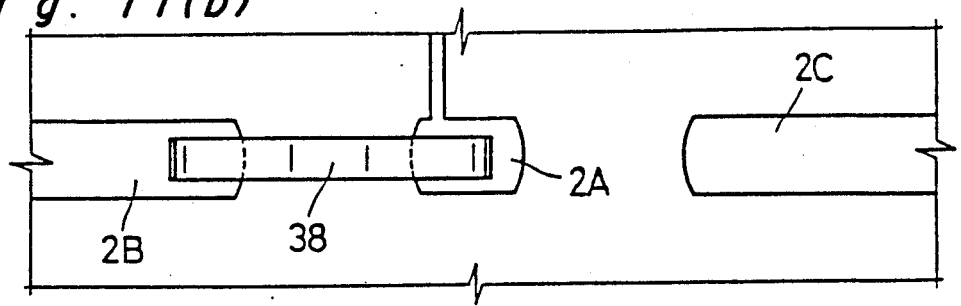
Figure 11C:
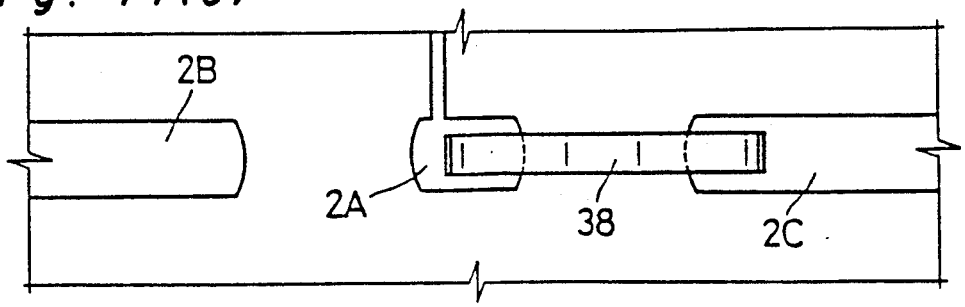

As best shown in FIGS. 10 and 11(a) to 11(c), the slide member 30 carries a generally elongated movable bridge contact member 38 made of flexible electroconductive material secured at a generally intermediate portion thereof to the undersurface of the slide member 31 with its opposite ends held in sliding contact with an interior surface of the bottom panel of the calculator housing 1. On the printed circuit board 2 and along the path of movement of the bridge contact member 38 parallel to the direction of movement of the slide member 31, there is disposed three fixed contact members 2A, 2B and 2C, each neighboring contact members 2A and 2B, or 2A and 2C, being adapted to be electrically connected together through the bridge contact member 38 depending on the position of the slide member 30. The condition in which the contact members 2A and 2B are connected together through the bridge contact member 38 when the slide member 30 is moved from the neutral position to one of the lateral positions is shown in FIG. 11(b); the condition in which the contact members 2A and 2C are connected together through the bridge contact member 38 when the slide member 30 is moved from the neutral position to the other of the lateral positions is shown in FIG. 11(c); and the condition in which the slide member 30 is held at the neutral position and no electric contact between the bridge contact member 38 and any one of the fixed contact members 2A to 2C take place is shown in FIG. 11(a). Thus, the slide member 31 serves not only as a manipulatable key for selectively enabling and disabling the movement of any one of the first and second battery mounts 10 and 20 between the completely inserted position and the drawn position, but also as a mode changeover switch operable selectively between a normal operating mode, in which input and output processes performed by a central processing unit 50 (FIG. 16) relative to a random access memory or storage unit 52 (FIG. 16) can be enabled, and a battery replacement mode in which the above described processes are disabled.

As best shown in FIGS. 3 and 4, a rear wall defining, and confronting the opening leading into, the first battery storage compartment 5 has a pair of resilient contact members 40 and 41 secured thereto so as to protrude into the first battery storage compartment 5 and connected electrically with circuit component parts on the printed circuit board 2. The resilient contact member 40 is adapted to contact a electrode of one of the drive batteries 7A and 7B when the first battery mount 10 with the drive batteries 7A and 7B seated in the respective pockets 11 and 12 is inserted into the first battery storage compartment 5 and held at the completely inserted position, while the resilient contact member 41 is adapted to contact the negative electrode of the other of the drive batteries 7A and 7B through the associated terminal disc 11B or 12B. It is to be noted that, although not shown, the terminal discs 11B and 12B forming the respective bottoms of the battery pockets 11 and 12 in the first battery mount 10 are so designed as to permit the drive batteries 7A and 7B to be connected electrically in series with each other.

Similarly, a rear wall defining, and confronting the opening leading into, the second battery storage compartment 6 has a pair of resilient contact members 42 and 43 secured thereto so as to protrude into the second battery storage compartment 6 and connected electrically with circuit component parts on the printed circuit board 2. The resilient contact member 42 is adapted to contact a positive electrode of the back-up battery 7C when the second battery mount 20 with the back-up battery 7C seated in the pocket 21 is inserted into the second battery storage compartment 6 and held at the completely inserted position, while the resilient contact member 43 is adapted to contact the negative electrode of the back-up battery 7C through the associated terminal disc 21B.

Figure 12:
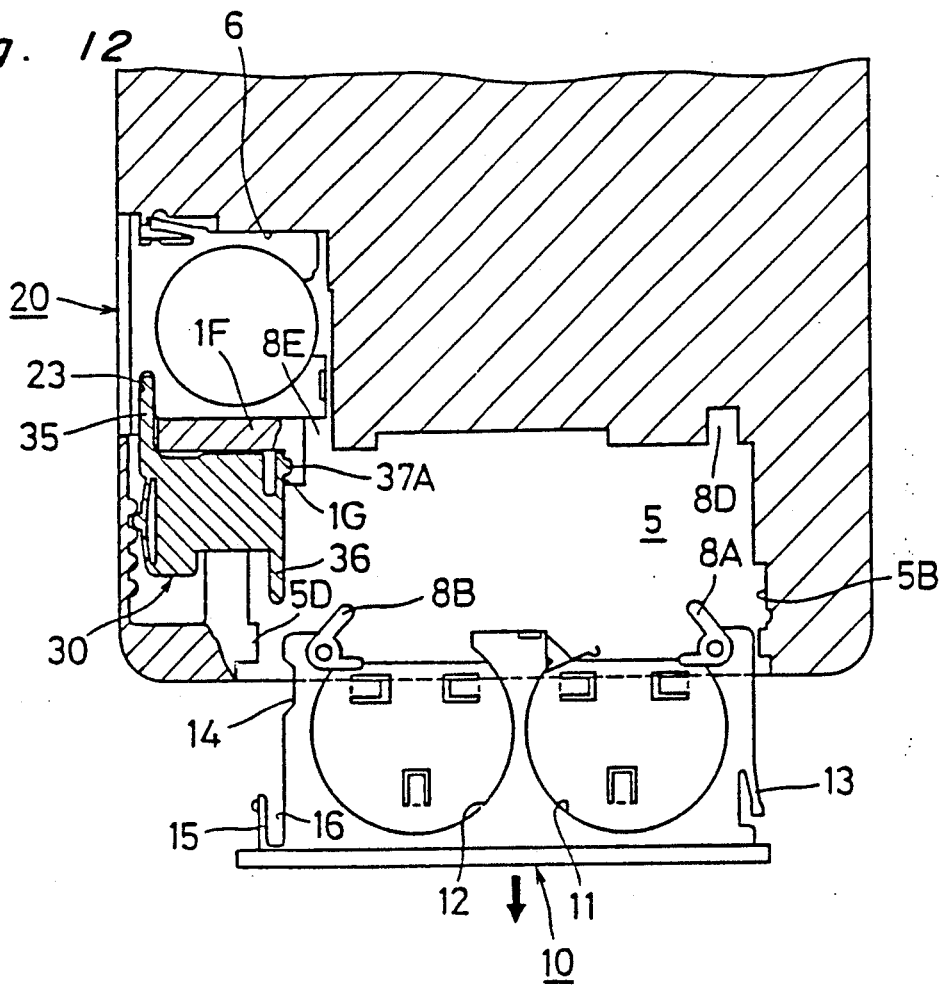
FIG. 12 is a view similar to FIG. 3, showing the second battery mount having been drawn outwardly from a second storage compartment.
Figure 14:
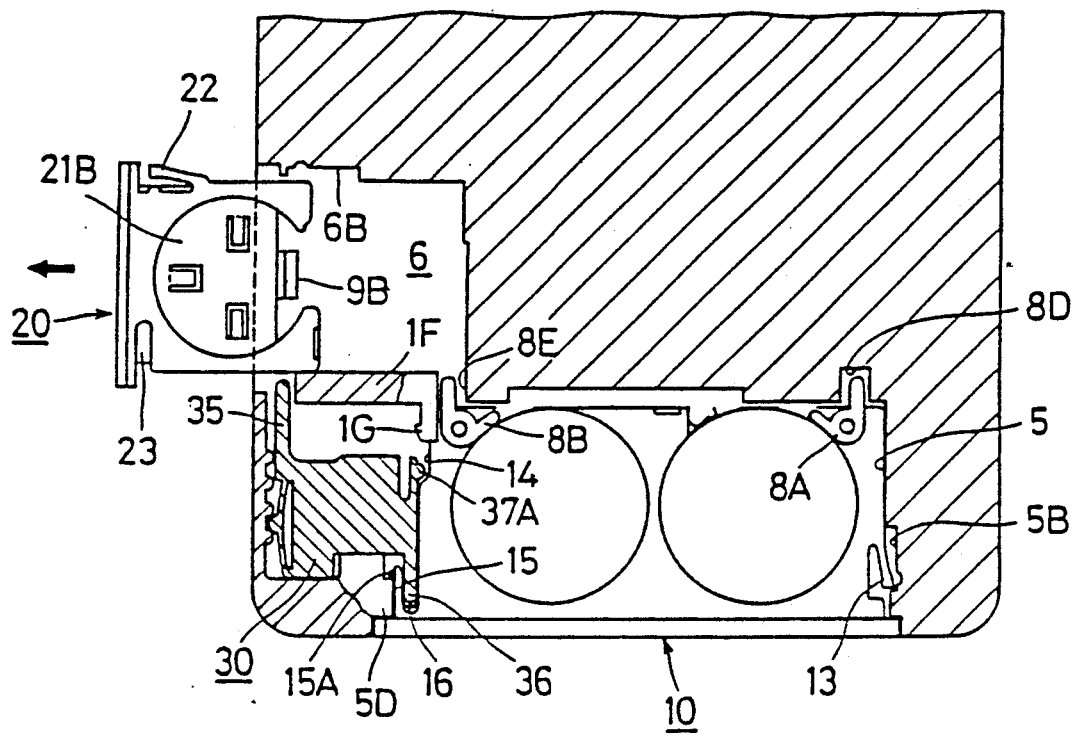
FIG. 14 is a view similar to FIG. 3, showing the second battery mount having been drawn outwardly from the second storage compartment.
Figure 15:
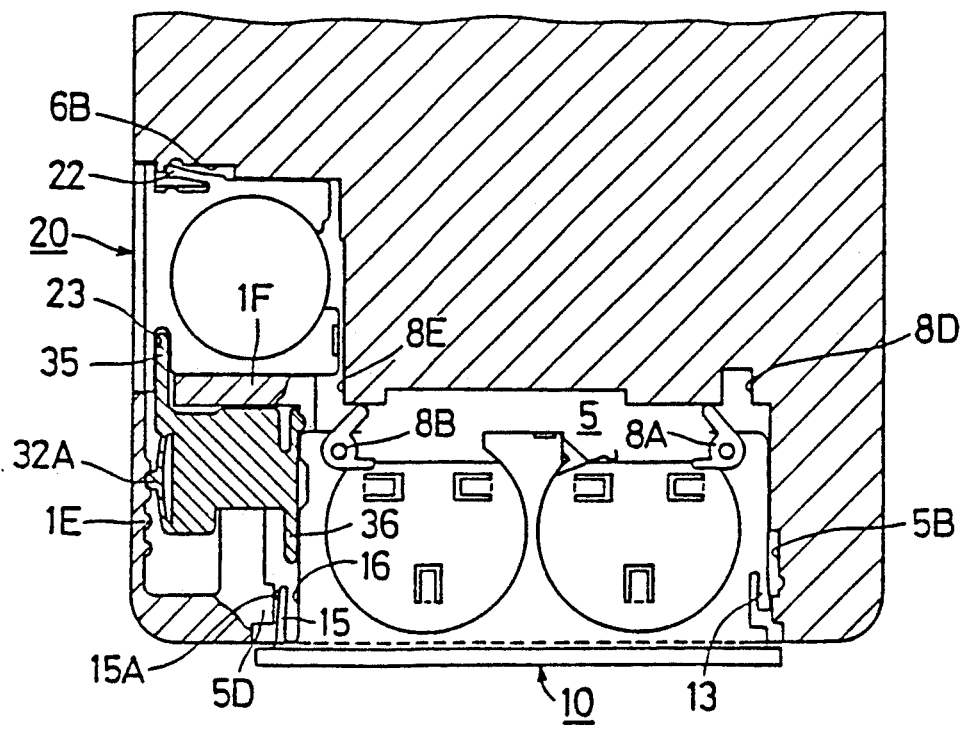
FIG. 15 is a view similar to FIG. 3, showing a condition in which the first battery mount is incompletely inserted into the first storage compartment.

As best shown in FIGS. 3 to 5, the first battery mount 10 has a pair of generally V-shaped barrier arms 8A and 8B which are pivotally mounted thereon at rear opposite corner regions for pivotal movement between block and release positions about a respective pivot pin, each of said V-shaped barrier arms 8A and 8B including first and second fingers that extend from the respective pivot pin so as to diverge outwardly. Each of the V-shaped barrier arms 8A and 8B is normally biased towards the block position, as shown in FIGS. 5 and 12, by the action of an associated torsion spring 8C with the first finger of the respective V-shaped barrier arm 8A and 8B protruding into the pocket 11 and 12. However, each V-shaped barrier arm 8A and 8B can be pivoted to the release position, as shown in FIGS. 3 and 14, when the associated drive battery 7A or 7B inserted into the corresponding pocket 11 or 12 in the first battery mount 10 is brought into contact with the first finger of the respective V-shaped barrier arm 8A and 8B causing the latter to pivot against the associated torsion spring 8C. Thus, it will readily be seen that, if the first battery mount 10 is inserted into the first battery storage compartment 10 with no drive batteries 7A and 7B received in the respective pockets 11 and 12, the second fingers of the V-shaped barrier arms 8A and 8B would not enter respective escapement recesses 8D and 8E formed in the rear wall defining the first battery storage compartment 10 and is hence brought into abutment with the rear wall defining the first battery storage compartment 10 as shown in FIG. 15, calling the operator's attention that any battery has not yet been mounted on the first battery mount 10. This incompletely inserted condition of the first battery mount 10 as shown in FIG. 15 occurs even when the operator has failed to mount at least one of the drive batteries 7A and 7B on the first battery mount 10. The first battery mount 10 can be completely inserted into the first battery storage compartment 10 as shown in FIG. 14 only when and after all necessary number of the batteries 7A and 7B have been properly mounted on the first battery mount 10.

In order to ensure that the second battery mount 20 can be completely inserted into the second battery storage compartment 6 only when and after the back-up battery 7C has been properly mounted thereon, i.e., seated in the pocket 21, a portion of the front panel of the calculator housing 1 adjacent the second battery compartment 6 is formed with a recess 6D in which a barrier piece 9B is non-detachably accommodated with a coil spring 9A interposed between it and the bottom of the recess 6D as best shown in FIGS. 6 and 7. This barrier piece 9B is normally biased by the coil spring 9A so as to protrude partially into the second battery storage compartment 6 and then into the pocket 21 in the second battery mount 20 through an opening in the terminal disc 21B and can be retracted inwardly of the recess 6D against the coil spring 9A thereby to clear from the terminal disc 21B when the back-up battery 7C is inserted into the pocket 21.

Figure 16:
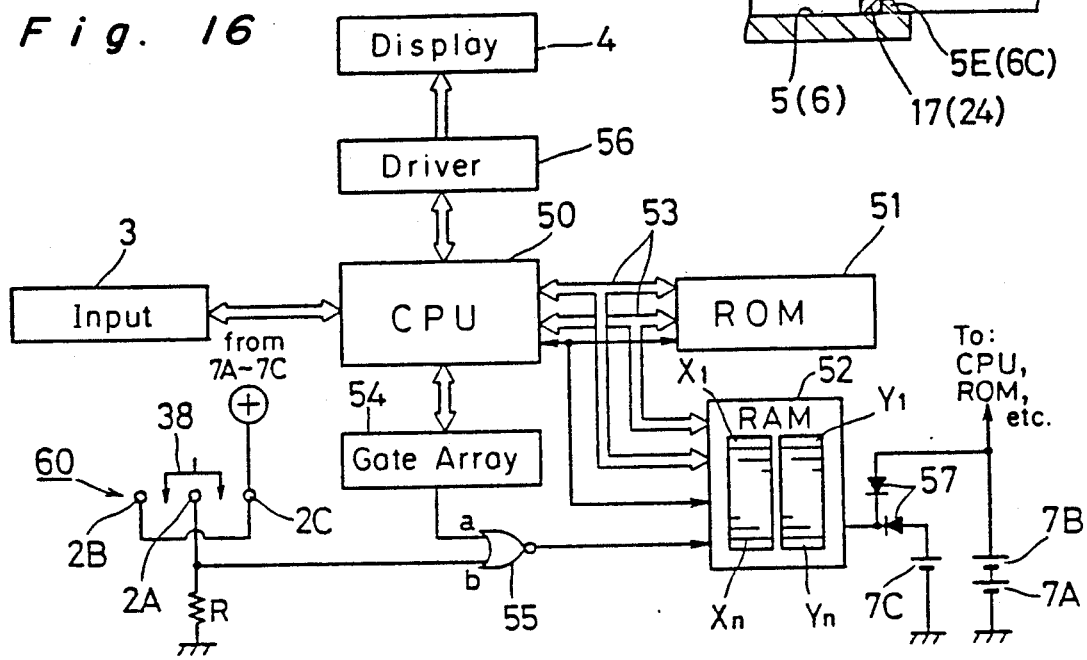
FIG. 16 is a circuit block diagram showing a battery circuit in relation to electric component parts of the electronic appliance.

Referring to FIG. 16, description will now be made of the electric circuit used in the electronic calculator in relation to the drive and back-up batteries 7A to 7C. The central processing unit (CPU) is operable according to a program stored in a built-in read-only memory (ROM) to execute various processes including search, display, calculation and so on. Information inputted through the keyboard 3 (FIG. 1) can be stored in and retrieved from a write-in/write-out random access memory (RAM) 52 having memory areas. In those memory areas of the random access memory 52, data on names of persons included in the input information can be stored at address locations $X_1$ to $X_n$ whereas data on telephone numbers of those persons included in the input information can be stored at address locations $Y_1$ to $Y_n$. The central processing unit 50 interfaces with any one of the read-only memory 51 and the random access memory 52 through address, data and control buses generally identified by 53. Reference numeral 54 represents a gate array operable to monitor various processes executed by the central processing unit 50. Specifically, the gate array 54 applies a low level signal to one of two input terminals, i.e., a terminal a, of a NOR gate 55 when and so long as the central processing unit 50 is in operation, but applied a high level signal to the other input terminal b of the NOR gate 55 when and so long as the central processing unit 50 is not operating. Reference numeral 56 represents a display drive circuit for driving the display unit 4 and reference numeral 57 represent reverse-flow preventive diodes.

The mode changeover switch previously described in connection with the details of the slide member 30 as operable selectively between the normal operating mode, in which input and output processes performed by the central processing unit 50 relative to the storage unit 52 can be enabled, and the battery replacement mode in which the above described processes are disabled, is generally identified by 60. As hereinbefore described, this mode changeover switch 60 comprises the movable bridge contact member 38 and the fixed contact members 2A to 2C which may be electrodes deposited on the printed circuit board 2. The intermediate contact member 2A is electrically connected to the ground through a pull-down resistor R and also to the input terminal b of the NOR gate 55, while the lateral contact members 2B and 2C are connected together and in turn to both of the drive batteries 7A and 7B and the back-up battery 7C.

While the mode changeover switch 60 is electrically connected as hereinabove described, the positioning of the slide member 30 at the neutral position with the bridge contact member 38 disengaged from any one of the fixed contact members 2A to 2C as shown in FIGS. 10 and 11(a), a low level signal is applied through the pull-down resistor R to the input terminal b of the NOR gate 55. However, when and so long as the slide member 30 is moved to any one of the lateral positions on respective side of the neutral position with the bridge contact member 38 connecting the neighboring fixed contact members 2A and 2B, or 2A and 2C, together as shown in FIGS. 11(b) or 11(c), respectively, a high level signal is applied to the input terminal b of the NOR gate 55.

Therefore, when a low level signal is applied to the input terminal a of the NOR gate 55 while the slide member 30 is in the neutral position as shown in FIG. 10 and, hence, the bridge contact member 38 does not connect the contact member 2A with any one of the lateral contact members 2B and 2C as shown in FIG. 11(a), the NOR gate 55 outputs a high level signal which is in turn supplied to a control signal terminal of the storage unit 52 thereby to bring the storage unit 52 in an operative position in which information can be selectively stored therein or read out therefrom. On the other hand, when a high level signal is applied to the input terminal a of the NOR gate 55 while the neighboring fixed contact members 2A and 2B or 2A and 2C are not connected together as shown in FIG. 11(a), the NOR gate 55 outputs a low level signal which is in turn supplied to the control signal terminal of the storage unit 52 thereby to bring the storage unit 52 in an inoperative position in which information can neither be read therein nor read out therefrom.

Where the neighboring fixed contact members 2A and 2B or 2A and 2C are electrically connected together through the bridge contact member 38 as shown in FIG. 11(b) or 11(c), respectively, that is, the slide member 30 is moved from the neutral position to any one of the lateral positions, the application of any one of the low and high level signals to the input terminal a of the NOR gate 55 results in the application of a low level signal from the NOR gate 55 to the control signal terminal of the storage unit 52 at all times and, therefore, under those circumstances, the storage unit 52 is maintained in the inoperative position.

Hereinafter, the manner in which the batteries are replaced with fresh ones will be described.

REPLACEMENT OF BATTERIES 7A AND 7B

When the drive batteries 7A and 7B are to be replaced with fresh ones, the slide member 30 held at the neutral position as shown by y in FIG. 2 has to be manually moved to the lateral position shown by x in FIG. 2, by the application of an external pushing force to the knob 32. As the slide member 30 is moved towards the lateral position x in a direction shown by X1 in FIG. 3, the elongated cam piece 37 is yielded against its own resiliency in the direction shown by the arrow in FIG. 9 with the cam protuberance 37A sliding over a cam edge, which is situated on one side of the cam groove 14 adjacent the first battery storage compartment 6, so as to escape from the cam groove 14. When the slide member 30 is moved to the lateral position x, the first latch piece 36 integral with the slide member 30 is moved out of the U-shaped cutout 16 in the first battery mount 10 as shown in FIG. 15. At the same time, the movement of the slide member 30 from the neutral position y to the lateral position x results in an establishment of the electric connection between the fixed contact members 2A and 2C through the bridge contact member 38 rigid with the slide member 30 as shown in FIG. 11(c) thereby to cause the electric system to establish the battery replacement mode.

In synchronism with the disengagement of the first latch piece 36 out from the U-shaped cutout 16 which takes place in the manner described above, the second latch piece 35 also integral with the slide member 30 is engaged deep into the U-shaped cutout 23 in the second battery mount 20, thereby locking the second battery mount 20 in the completely inserted position as shown in FIG. 15.

Thereafter, the first resilient tongue 13 integral with the first battery mount 10 has to be displaced against its own resiliency in a direction shown by the arrow Y in FIG. 3 to allow it to be disengaged from the detent recess 5B. This displacement of the first resilient tongue 13 is effected by the application of an external force which may be applied through the tip of a ball-point pen, a pin or any other suitable elongated member and, for this purpose, the bottom panel of the calculator housing 1 may have an access aperture defined therein for the insertion of the elongated member necessitated to displace the first resilient tongue 13. Once the first resilient tongue 13 is disengaged from the detent recess 5B, the first battery mount 10 having the drive batteries 7A and 7B thereon can be brought in a position ready to be drawn outwardly from the first battery storage compartment 5 towards the drawn position as shown in FIG. 12.

An actual movement of the first battery mount 10 from the completely inserted position towards the drawn position can be effected by manually pulling the first battery mount 10 in a direction outwardly of the calculator housing 1 with her or his fingers gripping a side wall of the first battery mount 10 which is in flush with the end wall of the calculator housing 1. As the first battery mount 10 is manually pulled in this way, the detent protuberance 15A integral with the second resilient tongue 15 slides over the detent projection 5D as shown in FIG. 15, allowing the first battery mount 10 to be further moved towards the drawn position as shown in FIG. 12.

When the first battery mount 10 being drawn outwardly from the first battery storage compartment 5 arrives at the drawn position as shown in FIG. 12, the stop projection 17 integral with the first battery mount 10 is brought into contact with the rib 17 integral with the bottom panel of the calculator housing 1 as shown in FIG. 13 and, therefore, the first battery mount 10 can not be further drawn outwardly from the calculator housing 1. At the same time, by the effect of resiliencies of the contact pieces 11C and 12C in the respective terminal discs 11 and 12, the associated drive batteries 7A and 7B can be slightly popped up thereby to facilitate a manual removal of the drive batteries 7A and 7B in readiness for the replacement with corresponding fresh drive batteries.

Also, the arrival of the first battery mount 10 at the drawn position causes the engagement projection 37B integral with the cam piece 37 of the slide member 30 to be engaged with the hook member 1G integral with the rib 1F on the bottom panel of the calculator housing 1 as shown in FIG. 12 and, therefore, the slide member 30 is retained as moved to the position x in which condition the bridge contact member 38 rigid with the slide member 30 is held in position to connect the fixed contact members 2A and 2C together as shown in FIG. 11(c). Thus, a changeover from the battery replacement mode back to the normal operating mode will not be accomplished once the slide member 30 has been completely moved to the position x.

With the first battery mount 10 having been drawn outwardly from the first battery storage compartment 5 as shown in FIG. 12, the drive batteries 7A and 7B can be replaced with the corresponding fresh drive batteries. After this replacement, the first battery mount 10 having the fresh drive batteries mounted thereon has to be exteriorly pushed to slide deep into the first battery storage compartment 5 to assume the completely inserted position. Substantially simultaneously with the return of the first battery mount 10 to the completely inserted position, the first resilient tongue 13 expands by the effect of its own resiliency and is then engaged into the detent recess 5B with the first battery mount 10 consequently retained at the completely inserted position. In this condition, even though the slide member 30 is still at the lateral position x, a mere pull of the first battery mount 10 will not result in a movement of the first battery mount 10 in a direction outwardly from the first battery storage compartment 5.

Figure 9:
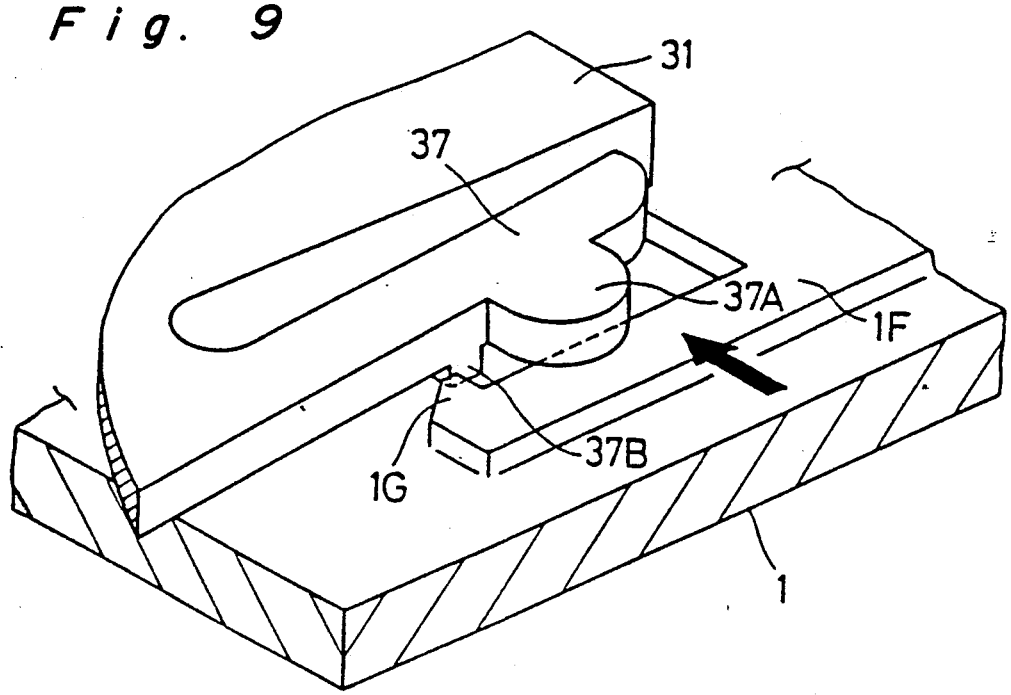
FIG. 9 is a view similar to FIG. 8, showing the slide member in a different operative position.

Also, the return of the first battery mount 10 to the completely inserted position allows the engagement projection 37B integral with the cam piece 31 to be disengaged from the hook member 1G as shown in FIG. 9 and, therefore, the slide member 30 can be manually moved back to the neutral position y at any desired time. Of course, the user or operator has to manually move the slide member 30 back to the neutral position y after the battery replacement has been completed and the electric calculator is actually utilized with the fresh drive batteries. It is to be noted that, as an alternative measures, any suitable spring means may be employed to maintain the slide member 30 at the neutral position at all times and also to cause the slide member 30, when moved to any one of the lateral positions x and z shown in FIG. 2, to return to the neutral position.

Where the user or operator fails to mount the fresh drive batteries onto the first battery mount 10 and then moves the latter deep into the first battery storage compartment 5, the first battery mount 10 cannot be completely inserted into the first battery storage compartment 5. This is possible because, as shown in FIG. 15, the V-shaped barrier arms 8A and 8B are biased to the block positions, when and so long as the battery pockets 11 and 12 are empty, and therefore, the respective second fingers of those barrier arms 8A and 8B will not enter the associated escapement recesses 8D and 8E. The complete insertion of the first battery mount 10 deep into the first battery storage compartment 5 can be accomplished only after the fresh drive batteries have been mounted on the first battery mount 10.

REPLACEMENT OF BACK-UP BATTERY 7C

The replacement of the back-up battery 7C with a corresponding fresh battery necessitates the slide member 30 to be moved from the neutral position y towards the lateral position z shown in FIG. 2 in a direction counter to the direction in which it is moved for the replacement of the drive batteries 7A and 7B. Specifically, when the slide member 30 is moved to the lateral position z, the second latch piece 35 integral therewith is disengaged from the U-shaped cutout 23 defined in the second battery mount 20 and, at the same time, the bridge contact member 38 rigid with the slide member 30 is moved to a position in which the fixed contact members 2A and 2B are connected together through the bridge contact member 38, as shown in FIG. 11(b), to cause the electric system to assume the battery replacement mode. In synchronism with the movement of the slide member 30 towards the position z in a direction shown by the arrow X2 in FIG. 3, the first latch piece 36 integral with the slide member 30 protrudes deep into the U-shaped cutout 16 in the first battery mount 10, causing the second resilient tongue 15 to be firmly clamped between the first latch piece 36 and the projection 5D with the detent protuberance 15A firmly trapped by the projection 5D as shown in FIG. 14. Consequently, the first battery mount 10 is locked in the completely inserted position.

After the slide member 30 has been moved to the position z, the third resilient tongue 22 integral with the second battery mount 20 has to be displaced against its own resiliency in a direction inwardly thereof shown by the arrow Z in FIG. 3 to allow it to be disengaged from the detent recess 6B. This displacement of the third resilient tongue 22 is effected by the application of an external force which may be applied through the tip of a ball-point pen, a pin or any other suitable elongated member and, for this purpose, the bottom panel of the calculator housing 1 may have an access aperture defined therein for the insertion of the elongated member necessitated to displace the third resilient tongue 22. Once the third resilient tongue 22 is disengaged from the detent recess 6B, the second battery mount 20 having the backup battery 7C thereon can be brought in a position ready to be drawn outwardly from the second battery storage compartment 6 towards the drawn position as shown in FIG. 12.

An actual movement of the second battery mount 20 from the completely inserted position towards the drawn position can be effected by manually pulling the second battery mount 20 in a direction outwardly of the calculator housing 1 with her or his fingers gripping a side wall of the second battery mount 20 which is in flush with the side wall of the calculator housing 1. When the second battery mount 20 being drawn outwardly from the second battery storage compartment 6 arrives at the drawn position as shown in FIG. 14, the stop projection 24 integral with the second battery mount 20 is brought into contact with the rib 6C integral with the bottom panel of the calculator housing 1 as shown in FIG. 13 and, therefore, the second battery mount 20 can not be further drawn outwardly from the calculator housing 1. At the same time, by the effect of resiliencies of the contact pieces 21C in the terminal disc 21, the back-up battery 7C can be slightly popped up thereby to facilitate a manual removal of the back-up battery 7C in readiness for the replacement with the fresh back-up battery.

Once the second battery mount 20 has been completely drawn outwardly from the second battery storage compartment 6, the slide member 30 moved to the position z can no longer be moved back to the neutral position y or to the opposite position x. This is because, as best shown in FIG. 14, any attempt to move the slide member 30 towards the neutral position results in abutment of the tip of the second latch piece 35 with an adjacent side edge of the second battery mount 20, thereby preventing the first battery mount 10 from being drawn outwardly from the first battery storage compartment 5. Thus, the electric system can be maintained in the battery replacement mode.

With the second battery mount 20 having been drawn outwardly from the second battery storage compartment 6 as shown in FIG. 14, the back-up battery can be replaced with the corresponding fresh back-up. After this replacement, the second battery mount 20 having the fresh back-up battery mounted thereon has to be exteriorly pushed to slide deep into the second battery storage compartment 6 to assume the completely inserted position. Substantially simultaneously with the return of the second battery mount 20 to the completely inserted position, the third resilient tongue 22 expands outwardly by the effect of its own resiliency and is then engaged into the detent recess 6B with the second battery mount 20 consequently retained at the completely inserted position. In this condition, even though the slide member 30 is still at the lateral position z, a mere pull of the second battery mount 20 will not result in a movement of the second battery mount 20 in a direction outwardly from the second battery storage compartment 6. However, the slide member 30 can now be movable from the position z towards the neutral position or the opposite position x since the U-shaped cutout 23 in the second battery mount 20 is, when the latter is in the completely inserted position, aligned with the second latch piece 35 integral with the slide member 30. It is to be noted that, where the spring means is employed to bias the slide member 30 only towards the neutral position as hereinbefore suggested, the slide member 30 can automatically return to the neutral position with the second latch piece 35 engaged into the U-shaped cutout 23 upon the return of the second battery mount 10 back to the completely inserted position subsequent to the battery replacement.

When and so long as no battery is inserted into the pocket 21 in the first battery mount 20 while the latter is moved to the drawn position, the barrier piece 9B remains projected outwardly by the action of the coil spring 6D and, accordingly, the second battery mount 20 cannot be moved inwardly into the second battery storage compartment 6 with the barrier piece 9B held in contact with a rear edge of the terminal disc 21B as shown in FIGS. 6 and 14. Where the user or operator fails to mount the fresh back-up battery onto the second battery mount 20 and then attempts to move the latter deep into the second battery storage compartment 6, the second battery mount 20 cannot be completely inserted into the second battery storage compartment 6. Only when the fresh back-up battery has been inserted into the pocket 21 in the second battery mount 20, the barrier piece 9B is retracted inwardly of a recess against the coil spring 6D, permitting the second battery mount 20 to be moved inwardly of the second battery storage compartment 6.

Thus, subsequent to the completion of replacement of the drive batteries with the corresponding fresh drive batteries or that of the back-up battery with the corresponding fresh back-up battery, the slide member can be moved from the position x or z back to the neutral position y. In synchronism with the movement of the slide member 30, the bridge contact member 38 moves to connect the fixed contact members 2A and 2C or 2B together and, therefore, the electric system can resume the normal operating mode in response to the output signal from the gate array 54. Once the slide member has been returned to the neutral position as shown in FIG. 3, neither the first battery mount 10 nor the second battery mount 20 can be moved outwardly of the associated battery storage compartment 5 or 6.

Figure 17:
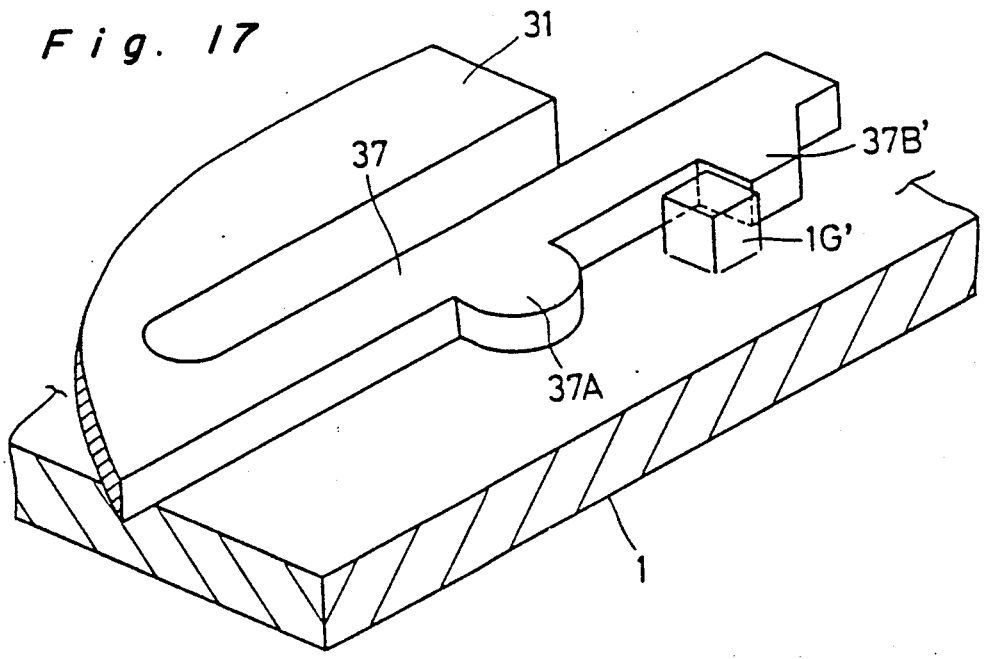
FIG. 17 is a view similar to FIG. 8, showing the slide member according to a second preferred embodiment of the present invention.

FIG. 17 illustrates a modified form of the elongated cam piece 37 wherein, while the cam protuberance 37A is formed with a generally intermediate portion thereof, a hook member 37B' functionally corresponding to the engagement projection 37B in the foregoing embodiment is formed with a free end of the cam piece 37 and, on the other hand, an engagement projection 1G' functionally corresponding to the hook member 1G is formed on the front panel of the calculator housing 1.

Also, although reference has been made to the use of the two drive batteries 7A and 7B and, accordingly, the first battery mount 10 has been shown and described as having the correspondingly two pockets 11 and 12, the first battery mount may have only one pocket where the electric system can work with the single drive battery.

While in the foregoing embodiment shown in and described with reference to FIGS. 1 to 17 the first and second battery, storage compartments 5 and 6 have been shown as arranged in a generally L-shaped configuration, with the intermediate space 1C defined therebetween, while opening at one end and one side of the calculator housing 1, they may juxtaposed so as to open at one end, or one side, of the calculator housing 1 according to a second preferred embodiment of the present invention which will now be described with particular reference to FIGS. 18 to 21.

Figure 18:
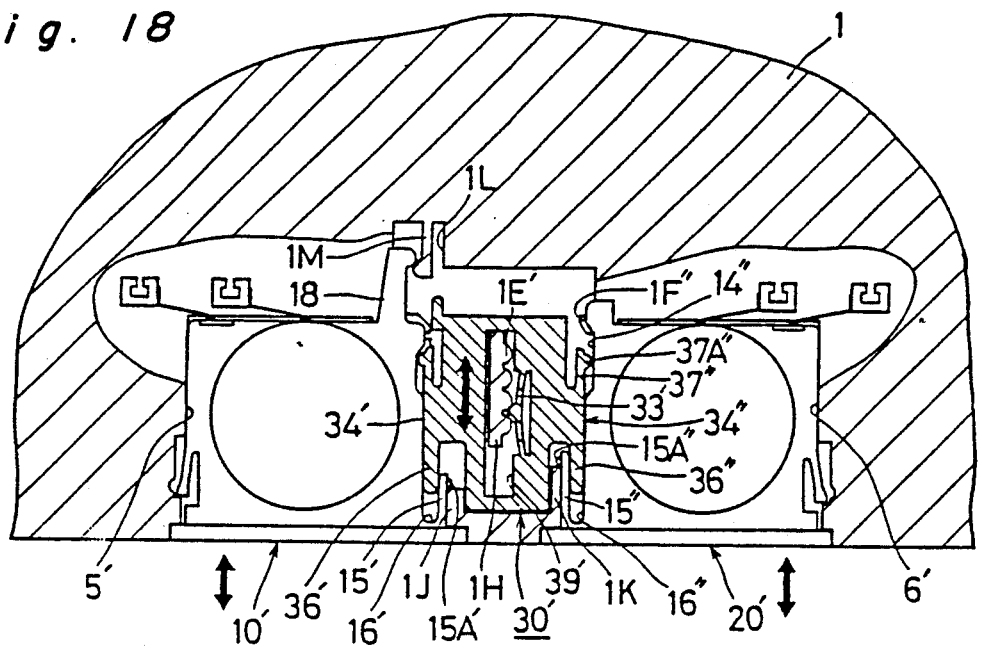
FIG. 18 is a sectional view showing the battery storage structure according to the second preferred embodiment of the present invention.

Referring to FIGS. 18 to 21, first and second battery compartments corresponding to the first and second battery compartments 5 and 6 in the foregoing embodiment are identified by 5' and 6', and a slide member corresponding to the slide member 30 in the foregoing embodiment is identified by 30'. As best shown in FIG. 18, the slide member 30' is positioned intermediate between the first and second battery compartments 5' and 6' which are symmetrical with respect to the slide member 30'. So far show, the first and second battery mounts identified by 10' and 20' are of identical construction since the first battery mount 10' shown therein is of a type having a single pocket for accommodating the correspondingly single drive battery. The first and second battery mounts 10' and 20' can be moved between the completely inserted position, as shown in FIG. 18, and the drawn position in a direction parallel to each other and the slide member 30' can be moved from a lock position, corresponding to the neutral position in the foregoing embodiment, to any one of first and second release positions in a direction parallel to the direction of movement of any one of the first and second battery mounts 10' and 20'.

In the following description, elements of the first battery mount 10' which are functionally similar to those elements of the first battery mount 10 in the foregoing embodiment are designated by like reference numerals used in the foregoing embodiment, but affixed with a single prime ('), and elements of the second battery mount 20' which are functionally similar to those elements of the second battery mount 20 in the foregoing embodiment are designated by like reference numerals used in the foregoing embodiment, but affixed with a double prime (").

The slide member 30' has a generally rectangular opening 39' defined therein, one side edge adjacent the rectangular opening 39' being formed with an arcuate arm 33', similar in function to the arcuate arm 33 shown in FIG. 3. This slide member 30' is mounted on the bottom panel of the calculator housing 1 with a rib 1H passed through the rectangular opening 39' for guiding the movement of the slide member 30' from the lock position to any one of the first and second release positions in a direction parallel to the longitudinal axis of the rectangular opening 39'. The rib 1H rigid or integral with the bottom panel of the calculator housing 1 has three detent recesses 1E' corresponding to the detent positions for the movement of the slide member 30'. The slide member 30' also has first and second side edges opposite to each other and confronting the first and second battery storage compartments 5' and 6', each of said first and second side edges of the slide member 30' being so structured and so configured to have a respective generally T-shaped latch member 34' and 34" similar in structure and function to the generally T-shaped latch member 34 used in the foregoing embodiment. Accordingly, elements of each of the T-shaped latch members 34' and 34" which functionally correspond to the respective elements of the T-shaped latch member 34 in the slide member 30 of the foregoing embodiment are designated by like reference numerals used in FIGS. 1 to 5 with a single or double prime (') or (") affixed thereto, respectively.

The second preferred embodiment of the present invention operated in the following manner.

Figure 19:
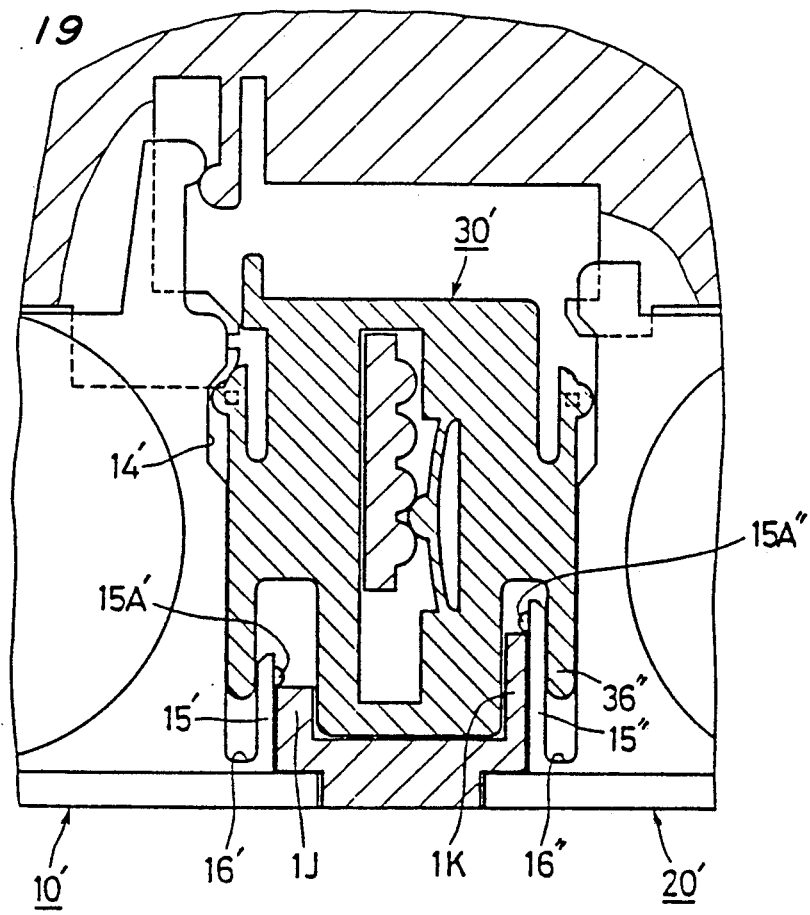
FIGS. 19 to 21 are sectional views, on an enlarged scale, of a portion of the battery storage structure shown in FIG. 18, showing the slide member brought to different operative positions, respectively.

When and so long as the slide member 30' is held at the lock position as shown in FIG. 19, the first latch piece 36' of the first T-shaped latch member 34' is engaged into the U-shaped cutout 16' in the first battery mount 10' and is therefore held in position to clamp the second resilient tongue 15' integral with the first battery mount 10' between it and a rib 1J integral with either the bottom panel or the front panel of the calculator housing 1. At the same time, the first latch piece 36" of the second T-shaped latch member 34" is engaged into the U-shaped cutout 16" in the second battery mount 20' and is therefore held in position to clamp the second resilient tongue 15" integral with the second battery mount 20' between it and a rib 1K integral with the bottom or front panel of the calculator housing 1. In this condition, the respective detent protuberances 15' and 15"·integral with the second resilient tongue 15' and 15" are trapped by the respective tips of the ribs 1J and 1K and, therefore, neither the first battery mount 10' nor the second battery mount 20' can be drawn outwardly from the associated battery storage compartment 5' and 6'. Although not·shown, the slide member 30' carries a bridge contact member similar to the bridge contact member 38 shown in FIG. 10 and, therefore, so long as the slide member 30' is held in the lock position, the electric system assumes the normal operating mode.

Figure 20:
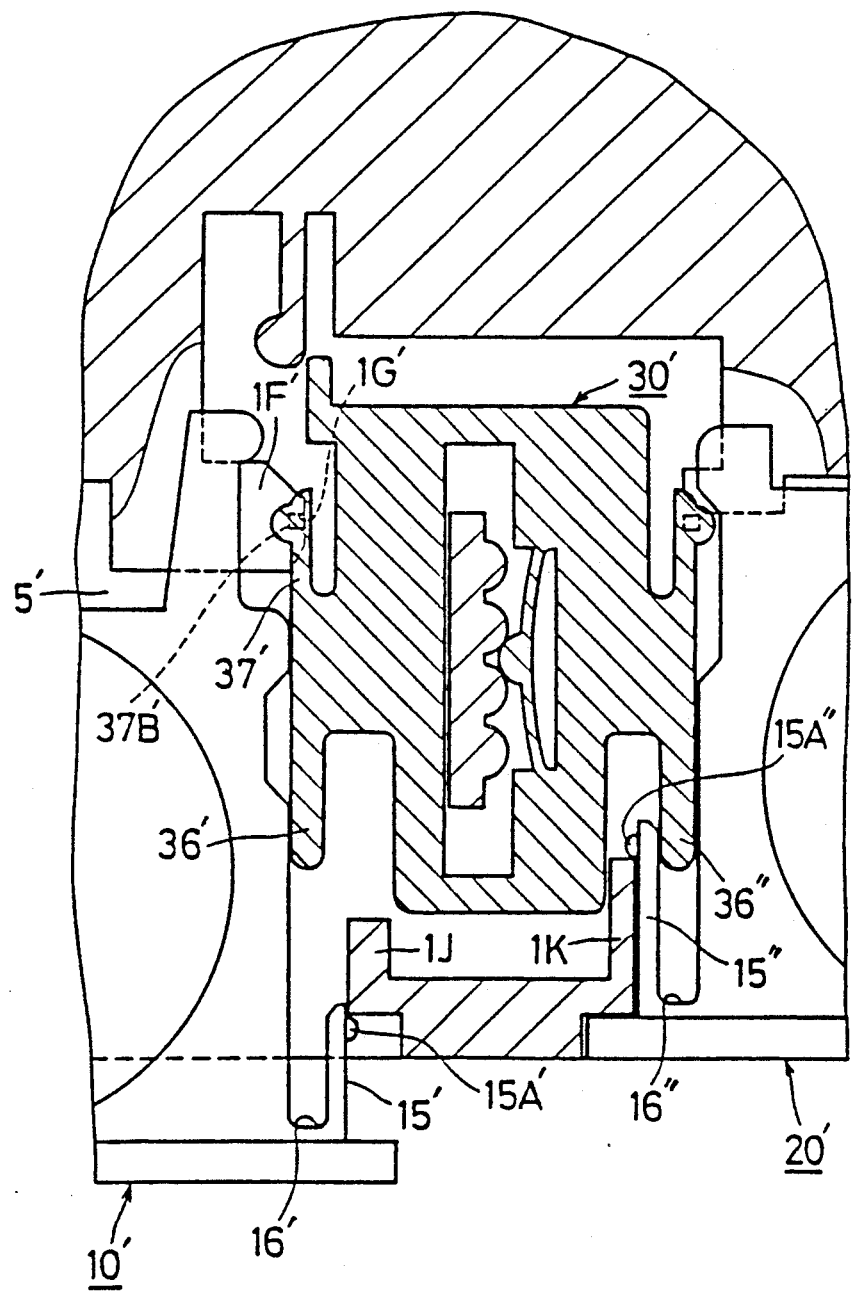

When the slide member 30' is moved from the lock position to the first release position defined intermediate between the lock position and the second release position as shown in FIG. 20, the first latch piece 36' of the first T-shaped latch member 34' adjacent the first battery mount 10' is completely disengaged out of the U-shaped cutout 16' in the first battery mount 10' while the first latch piece 36" of the second T-shaped latch member 34" remains engaged into the U-shaped cutout 16" in the second battery mount 20'. Disengagement of the first latch piece 36' of the first T-shaped latch member 34' from the U-shaped cutout 16' allows the first battery mount 10' to be brought into a condition ready to be drawn outwardly of the first battery storage compartment 5', whereas the second battery mount 20' is retained at the completely inserted position because the second resilient tongue 15" integral with the second battery mount 20" is still clamped between the first latch piece 36" of the second T-shaped latch member 34" and the rib 1K. Simultaneously with the arrival of the slide member 30' at the first release position shown in FIG. 20, the engagement projection 37B' integral with the elongated cam piece 37 of the slide member 30' is brought into engagement with the hook member 1G' integral with the rib 1F' and, therefore, the slide member 30' can be maintained immovable at the first release position.

Also, simultaneously with the arrival of the slide member 30' at the first release position, the electric system is changed from the normal operating mode over to the battery replacement mode.

Figure 21:
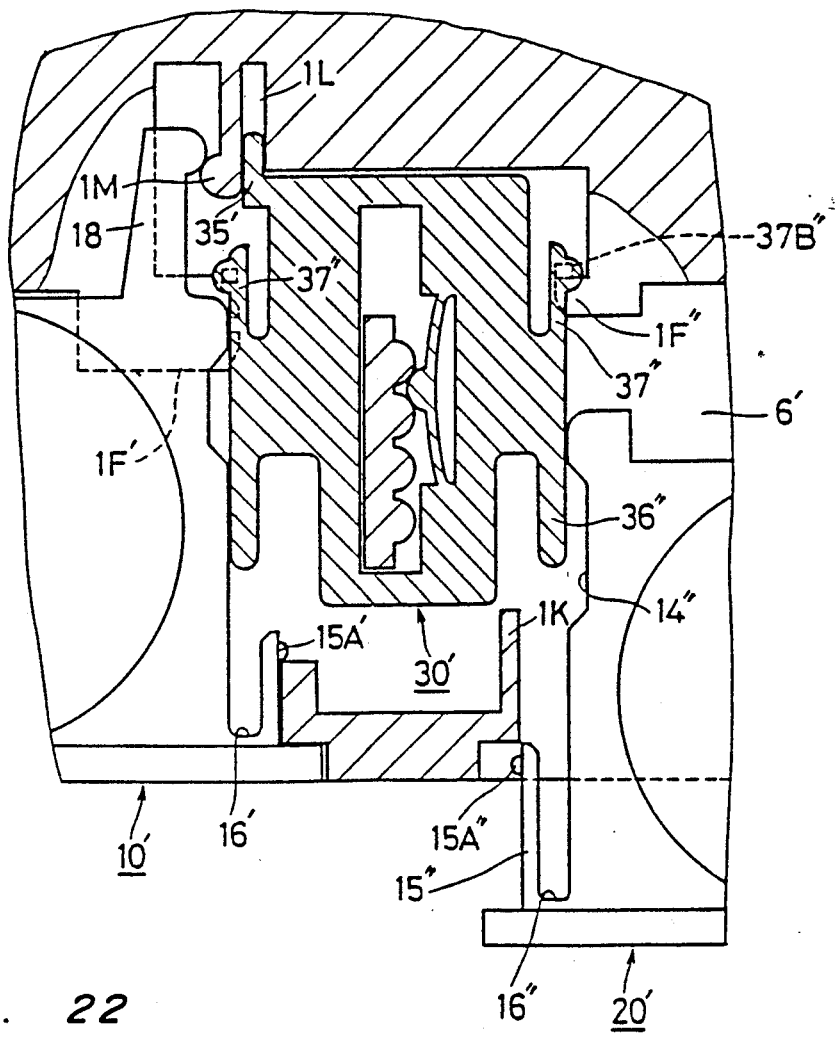

When the slide member 30' is moved to the second release position as shown in FIG. 21, the first latch piece 36" integral with the slide member 30' is completely disengaged out of the U-shaped cutout 16", allowing the second battery mount 20' to be brought into a condition ready to be drawn outwardly of the second battery storage compartment 6'. Although in this condition the engagement projection 37B' integral with the cam piece 37' of the second T-shaped latch member 34" is disengaged from the hook member 1G', the slide member 30' can be still held immovable because the engagement projection 37B" integral with the cam piece 37" of the second T-shaped latch member 34" is brought into engagement with the rib 1F" as best shown in FIG. 21.

At the same time, a generally elongated wedge piece 35' integral with the slide member 30' and extending in a rearward direction is engaged into a clamp recess 1L defined in the rear wall confronting the first battery storage compartment 5' so that a resilient tongue 1M integral with such rear wall can be clamped between the wedge piece 35' and a generally L-shaped arm 18 formed integrally with the first battery mount 10' so as to extend rearwardly therefrom, thereby locking the first battery mount 10' at the completely inserted position. Thus, when the second battery mount 20' is free to be drawn outwardly of the second battery storage compartment 6' as shown in FIG. 21, the first battery mount 10' can be advantageously retained at the completely inserted position. As is the case with the condition shown in FIG. 20, the electric system is kept switched over to the battery replacement mode even when the slide member 30' is moved to the second release position.

Although not shown in FIGS. 18 to 21, the second preferred embodiment of the present invention equally employs a barrier system, similar to that described in connection with the foregoing embodiment, by which any one of the first and second battery mounts once moved to the drawn position cannot be moved inwardly of the associated battery storage compartment where no battery substituted for the run-down battery is mounted thereon.

Figure 22:
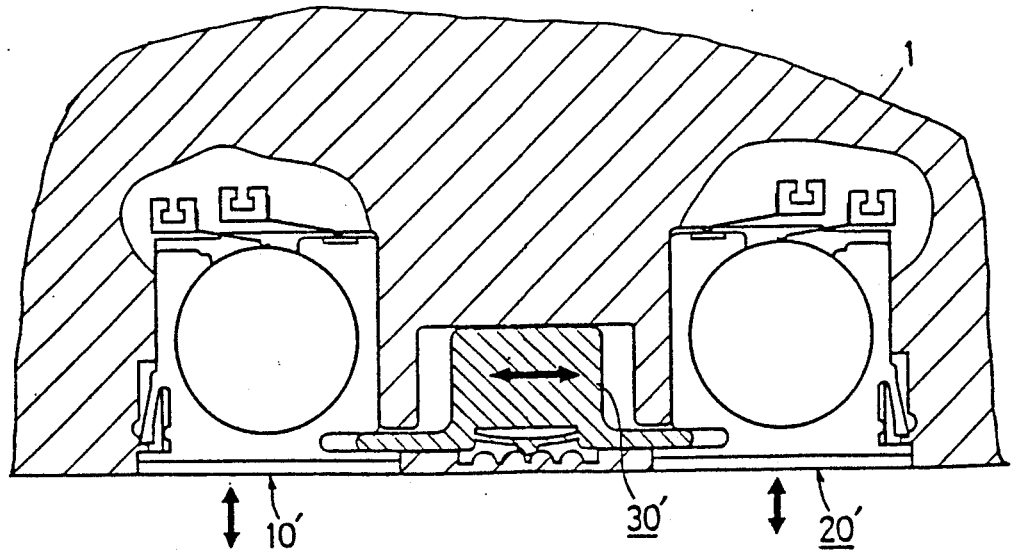
FIGS. 22 to 24 are sectional views showing the slide members used in the battery storage structure according to third, fourth and fifth preferred embodiments of the present invention, respectively.

A third preferred embodiment of the present invention is shown in FIG. 22. In this embodiment, the slide member 30' is so supported as to be moved in a direction perpendicular to the direction in which any one of the first and second battery mounts 10' and 20' can be moved between the completely inserted position and the drawn position. The first and second battery mounts 10' and 20' used in the practice of the second preferred embodiment of the present invention may be identical with the second battery mount 20 shown and described in connection with the first preferred embodiment of the present invention.

Figure 23:
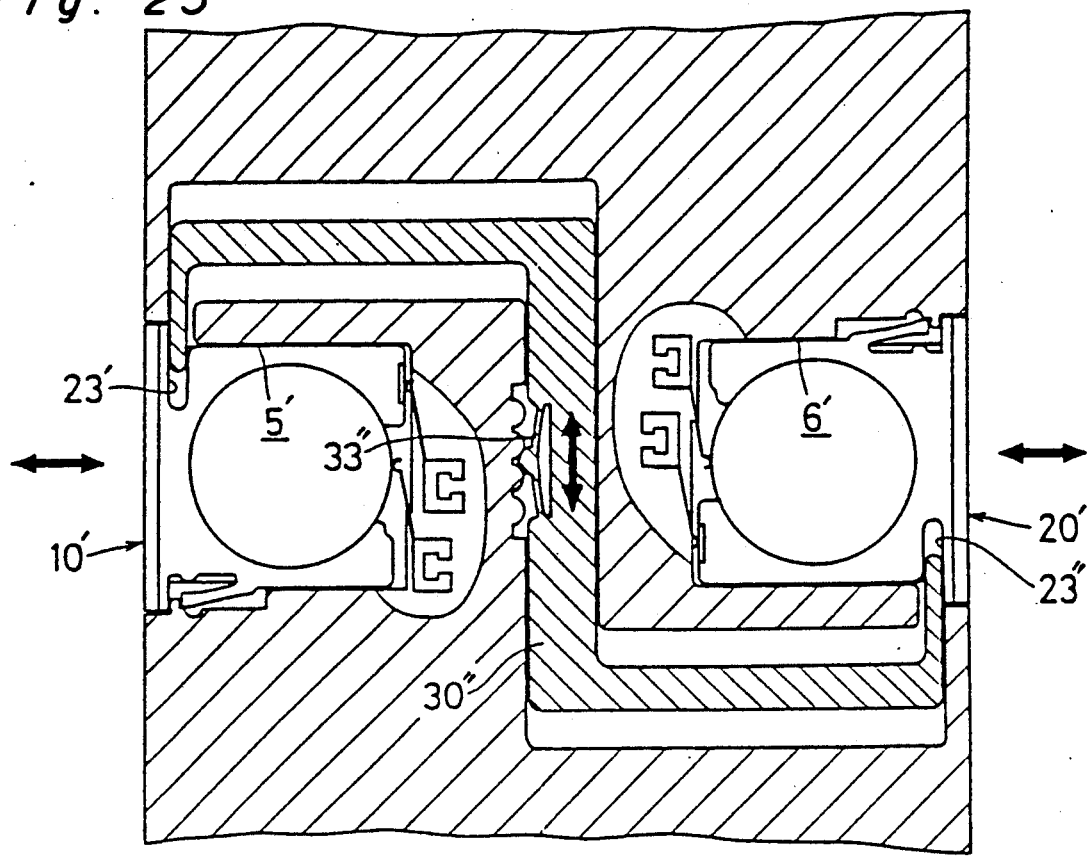
Figure 24:
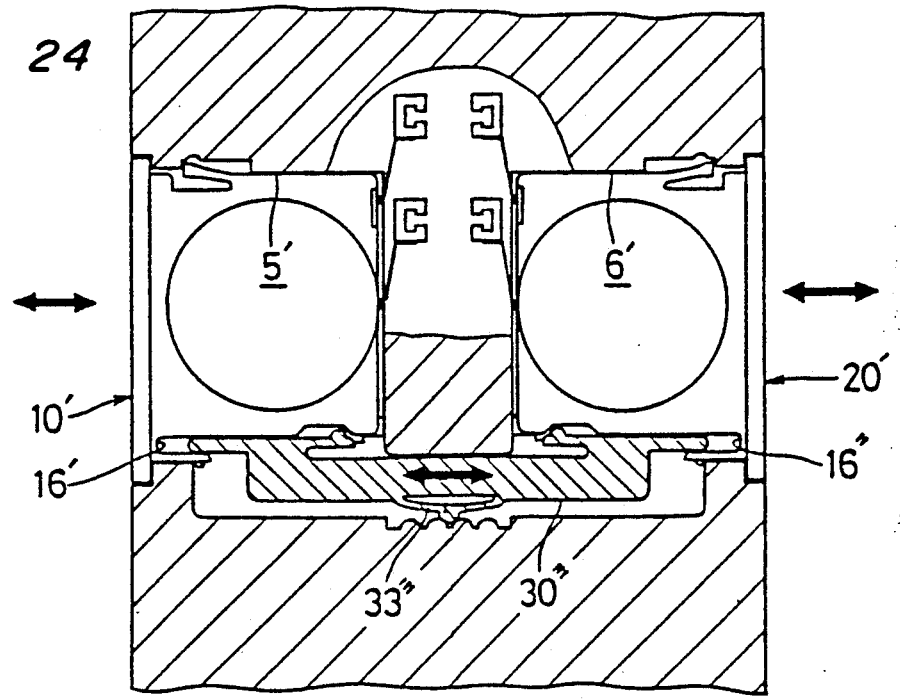

The first and second battery mounts 10' and 20' may be so supported as to be moved in respective directions opposite to each other during their movement between the completely inserted position and the drawn position, such as shown in FIGS. 23 and 24 which respectively illustrate fourth and fifth preferred embodiments of the present invention. In each of the fourth and fifth preferred embodiment of the present invention, the first and second battery storage compartments 5' and 6' opens outwardly through the opposite side edges of the calculator housing 1.

The first and second battery mounts 10' and 20' used in the fourth embodiment shown in FIG. 23 may be of a construction identical with those shown in and described with reference to FIG. 22, whereas the first and second battery mounts 10' and 20' in the fifth embodiment shown in FIG. 24 may be of a construction identical with those shown in and described with reference to FIGS. 18 to 21.

However, in the fourth preferred embodiment of the present invention shown in FIG. 23, the slide member designated by 30" is so shaped as to generally assume the shape of a figure of "Z" having its opposite ends bent so as to protrude into the first and second battery storage compartments 5' and 6' so long as it is held in the neutral position. A substantially intermediate portion of the slide member 30" that extends in a direction perpendicular to the direction of movement of any one of the first and second battery mounts 10' and 20' is formed with an arcuate arm 33" corresponding in function to the arcuate arm 33 shown in and described with reference to FIG. 3. It will readily be seen that, when the slide member 30" is moved from the neutral position as shown to one of the lateral positions defined on respective sides of the neutral position, one of the opposite ends of the slide member 30" is engaged into, for example, the U-shaped cutout 23' in the first battery mount 10', thereby to lock the first battery mount 10' at the completely inserted position, but the other of the opposite ends of the slide member 30" is disengaged from the U-shaped cutout 23' in the second battery mount 20', allowing the second battery mount 20' ready to be drawn outwardly from the second battery storage compartment 6'. On the other hand, when the slide member 30" is moved from the neutral position to the other of the lateral positions, the reverse to that described above takes place, locking the second battery mount 20' at the completely inserted position and allowing the first battery mount 10' ready to be drawn outwardly from the first battery storage compartment 5'.

The slide member designated by 30'" in FIG. 24 is in the form of a slide bar of a length smaller than the width of the calculator housing 1, having a generally intermediate portion thereof formed with a resilient arcuate arm 33'" corresponding in function and shape to the arcuate arm 33 of FIG. 3. This slide member 30'" has its opposite ends adapted to be partially engaged in the respective U-shaped cutouts 16' and 16", defined respectively in the first and second battery mounts 10' and 20', so long as it is held in the neutral position as shown. Each of the opposite ends of the slide member 30''' functions in cooperation with a resilient tongue, integral with the respective battery mount 10' or 20', to selectively retain and release the respective battery mount 10' or 20' in a manner similar to the resilient tongue shown by 15 in FIG. 4.

From the foregoing full description of the present invention made in connection with the preferred embodiments thereof, it has now become clear that, since the replacement of the drive battery or batteries and that of the back-up battery cannot be effected simultaneously and can be effected selectively, any possible erasure of the information stored in the storage unit can be positively avoided. According to the present invention, the replacement of any one of the drive battery or batteries and the back-up battery does not require a preparatory opening of a lid hitherto required, the battery replacement can be easily and quickly performed, thereby minimizing the possibility that the information stored in the storage unit may be destroyed under the influence of the electrostatic charge built up in the body of the user or operator.

Also, since the slide member for selectively allowing the battery mounts ready to be drawn outwardly of the associated battery storage compartments concurrently serves as the mode changeover switch, the possibility of the drive unit running out of control as a result of the battery replacement can be advantageously minimized.

Yet, according to the present invention, since arrangement has been made that, when one of the battery mounts is drawn outwardly from the associated battery storage compartment, the other of the battery mounts is locked at the completely inserted position, the possibility of all of the batteries being removed can be avoided advantageously. Furthermore, unless either the drive battery, or batteries, or the back-up battery is mounted on the associated battery mount, the latter can be pulled deep into the associated battery storage compartment, thereby preventing the other battery mount from being drawn outwardly from the associated battery storage compartment.

Although the present invention has fully been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A battery storage structure in an electric appliance which comprises:
   a housing for the electric appliance having at least one side face, said housing also having at least first and second storage compartments defined therein, each of said first and second storage compartments having an aperture open at said side face of the housing;
   first and second battery mounts one for each battery storage compartment, each of said first and second battery mounts being accommodated within the associated battery storage compartment for movement between a completely inserted position and a drawn position; and
   a manipulatable means operable to permit one of the first and second battery mounts to be movable from the completely inserted position towards the drawn position and to inhibit the other of the first and second battery mounts from being moved from the completely inserted position towards the drawn position.

2. The battery storage structure as claimed in claim 1, further comprising a mode changeover switch capable of assuming one of a normal operating mode, in which a drive unit of the electric appliance is permitted to selectively read in and read out information to a storage unit, and a battery replacement mode in which the drive unit is disabled to read in and read out the information, said mode changeover switch being operatively associated with the manipulatable means.

3. The battery storage structure as claimed in claim 1, further comprising means for constricting one of the first and second battery mounts at the completely inserted position when and so long as the other of the first and second battery mounts has been moved to the drawn position.

4. The battery storage structure as claimed in claim 2, further comprising means for constricting one of the first and second battery mounts at the completely inserted position when and so long as the other of the first and second battery mounts has been moved to the drawn position.

5. The battery storage structure as claimed in claim 1, further comprising a barrier means provided in association with each of the first and second battery mounts for blocking the movement of the respective battery mount from the drawn position back to the completely inserted position when the respective battery mount has no battery mounted thereon.

6. A battery storage structure in an electric appliance which comprises:
   a housing for the electric appliance having at least one side face, said housing also having at least first and second storage compartments defined therein, each of said first and second storage compartments having an aperture open at said side face of the housing;
   first and second battery mounts one for each battery storage compartment, each of said first and second battery mounts being accommodated within the associated battery storage compartment for movement between a completely inserted position and a drawn position; and
   a barrier means provided in association with each of the first and second battery mounts for blocking the movement of the respective battery mount from the drawn position back to the completely inserted position when the respective battery mount has no battery mounted thereon.

7. The battery storage structure as claimed in claim 6, further comprising a manipulatable means operable to permit one of the first and second battery mounts to be movable from the completely inserted position towards the drawn position and to inhibit the other of the first and second battery mounts from being moved from the completely inserted position towards the drawn position.

* * * * *